United States Patent [19]
Yamauchi et al.

[11] Patent Number: 5,812,492
[45] Date of Patent: Sep. 22, 1998

[54] CONTROL SIGNAL GENERATION CIRCUIT AND SEMICONDUCTOR MEMORY DEVICE THAT CAN CORRESPOND TO HIGH SPEED EXTERNAL CLOCK SIGNAL

[75] Inventors: Tadaaki Yamauchi; Takaharu Tsuji; Mikio Asakura, all of Hyogo, Japan

[73] Assignee: Mitsubishi Denki Kabushiki Kaisha, Tokyo, Japan

[21] Appl. No.: 781,013

[22] Filed: Jan. 10, 1997

[30] Foreign Application Priority Data

May 30, 1996 [JP] Japan .................................. 8-136936

[51] Int. Cl.$^6$ ....................................................... G11C 8/00
[52] U.S. Cl. .................................... 365/233.5; 365/193
[58] Field of Search .............................. 365/233.5, 193

[56] References Cited

U.S. PATENT DOCUMENTS 5,548,560  8/1996  Stephens et al. ..................... 365/233.5
5,557,582  9/1996  Kawamoto ........................... 365/233.5
5,629,896  5/1997  McClure .............................. 365/233.5

FOREIGN PATENT DOCUMENTS 6-303113  10/1994  Japan .

*Primary Examiner*—A. Zarabian
*Attorney, Agent, or Firm*—McDermott, Will & Emery

[57] ABSTRACT

A semiconductor memory device operates switched between a first readout mode in which data readout according to a specified activation of a column address strobe signal /CAS that shows a transition in synchronization with an external clock signal is output during a period including the specified activation of signal /CAS, and a second readout mode in which the readout data is output during a subsequent predetermined period of signal /CAS. A control circuit for controlling the data output timing from an output buffer activates the output buffer at an elapse of a predetermined time following the specified activation of signal /CAS in the first readout mode. In the second readout mode, the control circuit activates the output buffer according to activation of signal /CAS at a predetermined period.

9 Claims, 21 Drawing Sheets

FIG. 32 PRIOR ART
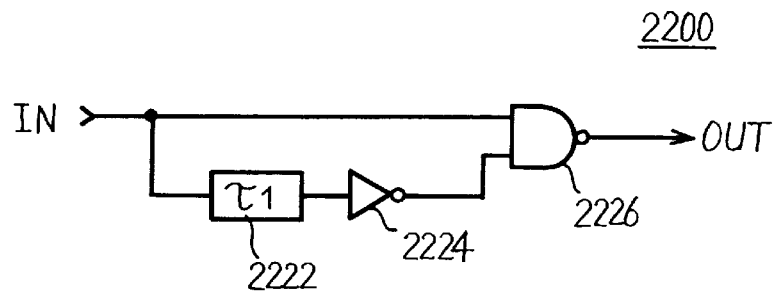
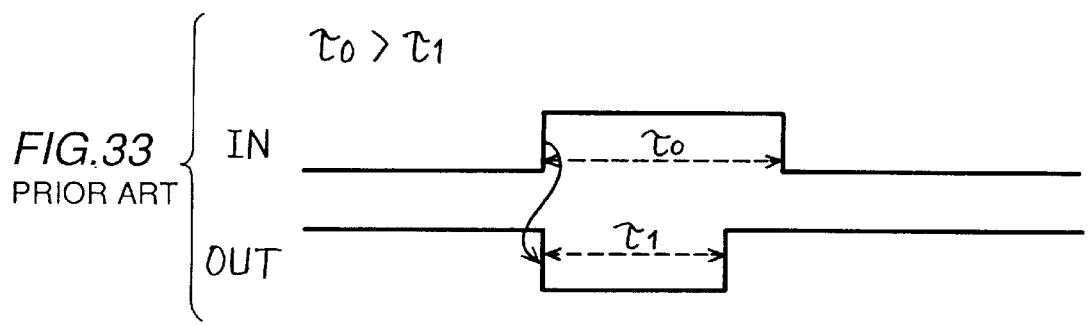
FIG. 33 PRIOR ART
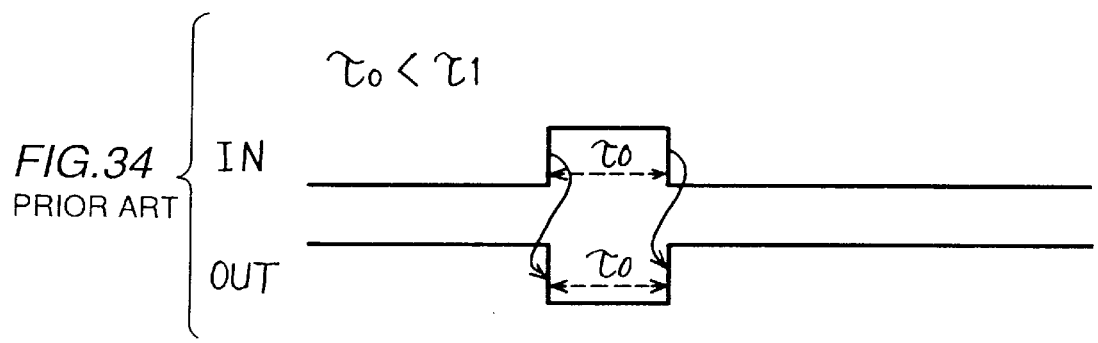
FIG. 34 PRIOR ART

CONTROL SIGNAL GENERATION CIRCUIT AND SEMICONDUCTOR MEMORY DEVICE THAT CAN CORRESPOND TO HIGH SPEED EXTERNAL CLOCK SIGNAL

BACKGROUND OF THE INVENTION

1. Field of the Invention

The present invention relates to semiconductor memory devices, and more particularly, to a dynamic semiconductor memory device that can operate at high speed and low power consumption. More specifically, the present invention relates to a semiconductor memory device that can operate switching among a plurality of data input/output modes at high speed and low power consumption.

2. Description of the Background Art

A semiconductor device that can operate in an operation mode called EDO (Extended Data Output) mode or hyper page mode is known as one semiconductor memory device that operates at a high rate.

FIG. 23 is a timing diagram showing this hyper page mode operation.

Referring to FIG. 23, a data readout operation is designated by an output enable signal ZOE attaining a reset state of an L level (logical low).

At time t1 and time t2 in the hyper page mode, a row address strobe signal ZRAS and a column address strobe signal ZCAS respectively attain an L level to receive an X address signal and an Y address signal for selecting four bits of memory cells simultaneously. According to the toggle of column address strobe signal ZCAS, data of the four bits of memory cells selected simultaneously are sequentially read out.

In the hyper page mode, a data output terminal DQ does not attain a high impedance state even when column address strobe signal ZCAS is rendered inactive to an H level (logical high). Therefore, the data read out at that cycle is continuously output. Data output terminal DQ attains a high impedance state when signals ZRAS and ZCAS both attain an inactive state of a high level.

In the above description, the prefix of Z of a signal reference implies that the signal attains an active state (low active) at an L level. In the following, Z or / is prefixed to the signal reference to indicate a low active signal.

The above-described hyper page mode has an advantage that the effective time period of a data output can be increased even when the cycle time tPC is shortened. Therefore, data can be read out correctly and at a higher rate in a hyper page mode even when the cycle time tPC is shortened.

Not only this hyper page mode of a data read out mode, but also the so-called nibble mode, for example, is characterized in that corresponding data during the cycle of the same ZCAS is output to data input/output terminal DQ after a column address is entered at time t2 and a column access operation is carried out. In the following, such a data read out mode is generically referred to as mode 1 of a data read out mode.

A semiconductor memory device operating in a pipe line burst mode (burst EDO mode), for example, is developed as a semiconductor memory device that has the cycle time period of data output reduced.

FIG. 24 is a timing chart showing a data read out operation of a semiconductor memory device with a pipe line burst mode. At time t1, row address strobe signal ZRAS attains an L level and X address signal X1 is entered. At time t2, column address strobe signal ZCAS attains an L level, and Y address signal Y1 is entered. As a result, four bits of memory cells per one data output terminal DQ are selected.

From the next ZCAS cycle, i.e. from time t3, each bit of the four-bit memory cell data is sequentially output for every transition of column address strobe signal ZCAS to an L level.

More specifically, data D1, D2, D3, and D4 are output at data output terminal DQ at the fall of column address strobe signal ZCAS at times t3, t4, t5, and t6, respectively.

In this pipe line burst mode, the data of the memory cell selected by the column address entered at time t2 should be output at the next ZCAS cycle, i.e. the cycle at time t3 where column address strobe signal ZCAS attains an L level.

Accordingly, the cycle time tPC during data read out can be made shorter than the time tA required starting from designation of a column address up to data readout.

Thus, data can be output at the cycle time period of a clock signal of the system, and at a high speed.

In this pipe line burst mode, input of another column address during data output allows memory cell data of four addresses to be selected according to the column address. Therefore, data can be read out continuously by sequentially entering another column address with respect to the memory cell of the same row address.

This means that corresponding data can be transferred at a higher rate with respect to a CPU (Central Processing Unit) which is an external processor. Similarly in this pipe line burst mode, data output terminal DQ attains an high impedance state when signals ZRAS and ZCAS both attain an H level to complete data readout.

The above-described readout mode in which data is read out subsequent to the cycle of a column address strobe signal by which column access is carried out is generically referred to as mode 2 of a data readout mode.

In recent dynamic semiconductor memory devices of a large capacity, some can implement both modes 1 and 2 by switching the operation mode in the same semiconductor chip.

The readout operation of mode 2 generally allows data to be read out at a rate higher than the read out operation of mode 1. In this case, operation control corresponding to each operation mode is required. Problems encountered in such cases will be described hereinafter.

FIG. 25 is a block diagram schematically showing a circuit configuration of a data readout unit 2000 of a conventional semiconductor memory device.

Data read out from a memory cell is transferred via a pair of IO lines I/O and ZI/O to be amplified by an amplifier 2002 and output to a data bus RBUS.

The readout data transmitted through data bus RBUS is held in a latch circuit 2006 in response to a logic gate 2004 rendered conductive according to activation of a signal DT. The data held in latch circuit 2006 drives the output levels of NAND circuits 2008 and 2010 in response to data output buffer activation signal OEM attaining an active state. In response, N channel MOS transistors 2012 and 2014 connected in series between a power supply potential Vcc and a ground potential Vss are respectively rendered conductive or non-conductive. The potential level of data output terminal DQ connected to the node of N channel MOS transistors 2012 and 2014 is driven to a level corresponding to the readout data.

FIG. 26 is a timing chart for describing an operation of data readout unit 2000 shown in FIG. 25.

Data D0 accessed at the rising edge of clock signal CLK at time t0 is read out to a read data bus RBUS shown in FIG. 25 during one clock period.

At time t1 which is the rising edge of the next clock signal CLK, signal DT is rendered active and an AND gate 2004 is rendered conductive. Data D0 output to read data bus RBUS is held in latch circuit 2006.

Output buffer activation signal OEM is generated in response to a rise of clock signal CLK at time t1 to attain an H level at an elapse of Δt which is a predetermined delay time from time t1. This means that there is a delay in the timing of data D0 being output to output terminal DQ after activation of the output buffer.

When data is to be read out at high speed in synchronization with an external clock signal, the time delay Δt of data output becomes so great that it cannot be neglected when the period of the internal clock signal becomes shorter than a certain period. Therefore, a data output terminal without such time delay is required to ensure high speed operation.

When operation is to be carried out switching between modes 1 and 2, the following problems occur as to the timing of activation of the output buffer.

FIG. 27 is a block diagram schematically showing a structure of an OEM generation circuit 2100 for generating a conventional output buffer activation signal OEM.

OEM generation circuit 2100 includes a counter 2110 receiving a signal /CAS for activating a signal CNT when the toggle count value matches a predetermined count value, a timing signal generation circuit 2120 receiving an address signal to detect its transition for providing signal DOT in response to the address transition, and an activation signal generation circuit 2140 receiving the above-described signals CNT, DOT and /CAS for altering the timing of generating output buffer activation signal OEM according to a signal /BURST designating a data readout mode.

Counter 2110 has signal /CAS inverted by an inverter circuit 2112 to count the toggle count value by cascade-connected flipflop circuits 2114 and 2116. Signal CNT is activated according to output Q0 of flipflop circuit 2114 and output Q1 of flipflop circuit 2116.

Timing signal generation circuit 2120 receives an output of address buffer 212 to which an address signal is input, and sets or resets the level of signal DOT according to an address transition detection signal (ATD signal) from address transition detection circuit 2124 that detects a transition in the received address signal.

Activation signal generation circuit 2140 receives signals /RAS, /CAS, /WE and /OE to alter the output signal OEM to a reset state when the chip attains a standby state, and an access operation is inactive.

Here, signal /RAS functions to activate the operation of row related circuitry of the semiconductor memory device, and signal /CAS functions to activate the operation of the row related circuitry of the semiconductor memory device.

Signals /WE is a write enable signal that designates data writing, and signal /OE is an output enable signal that designates data output.

Output control reset circuit 2152 renders reset signal RESET active when an access operation is completed.

Inversion circuit 2142 receives signal /CAS to provide an inverted signal to a delay circuit 2114. Delay circuit 2144 provides a signal CASD which is an inverted version of signal /CAS delayed for a predetermined time. An OR circuit 2146 receives signal /BURST designating a data readout mode and signal CNT to provide a logical sum thereof. AND circuit 2148 receives signal CASD, signal DOT, and an output of OR circuit 2146 to provide signal SET. SR flipflop circuit 2150 renders the output level of output buffer activation signal OEM to a set state and to a reset state according to received signals SET and RESET, respectively.

FIG. 28 is a timing chart for describing an operation of OEM generation circuit 2100 in mode 1 of a readout operation.

Mode 1 of a data read out operation is referred to as a "normal mode" hereinafter.

Referring to FIGS. 27 and 28, signal /BURST attains an H level in a normal mode. Therefore, the output of OR circuit 2146 always attains an H level regardless of signal CNT.

Therefore, when signal DOT and signal CASD applied to AND circuit 2148 both attain an H level, signal SET is rendered active, and signal OEM is driven to a set state of an H level.

Column address Y0 is entered at a time prior to the falling edge of signal /CAS of time t0 by an address set up time tASC. Address transition detection circuit 2124 detects this address transition, whereby an ATD pulse is generated. In response, signal DOT is driven to an active state of an L level. According to the AND output (output from AND circuit 2148) of signal DOT and signal CASD which is a delay signal of signal /CAS, the output level of flipflop circuit 2150 is set and output buffer activation signal OEM is driven to an H level.

Here, the generating timing of signal OEM must be controlled with signal CASD which is signal /CAS delayed for a predetermined time so that the output buffer is not erroneously activated during a column address access.

More specifically, if signal CASD is driven to an H level prior to signal DOT attaining an L level, as shown in the dotted line in FIG. 28, signal OEM will be pulled up to an H level during a memory cell access, whereby erroneous data will be output from data input/output terminal DQ.

When mode 2 of a data readout is controlled in OEM generation circuit 2100 of FIG. 27, problems set forth in the following occurs.

FIG. 29 is a timing chart showing the generation timing of signal OEM in mode 2 of a data readout operation by OEM generation circuit 2100.

In mode 2, signal /BURST attains an L level.

In order to output data at the elapse of one period from the fall of signal /CAS at time t0, counter circuit 2110 forms a 2-bit counter by D type flipflops to set signal CNT to an H level at time t1.

In mode 2, data is output at the toggle of the second signal /CAS after column address Y0 is entered. Therefore, another column address will not be input when signal OEM attains an H level. Signal OEM is set to an H level in response to signals CASD and CNT attaining an H level. Signal OEM is impervious to signal DOT. However, since signal CASD is a delayed version of signal /CAS to prevent an erroneous operation in a normal mode, signal OEM is driven to an H level at an elapse of time τd from time t2 where signal /CAS attains an active state of an L level.

In other words, there is a problem that the access time is delayed of output by τd from the fall of signal /CAS.

This time delay τd cannot be neglected when the toggle period of signal /CAS is reduced, i.e. when the period of an external clock signal is reduced.

Furthermore, the time delay in the counter that counts the toggle number of signal /CAS becomes a problem when the period of the external clock signal is reduced in mode 2 of a data readout operation as shown in FIG. 27.

FIG. 30 is a circuit diagram showing the main components of such a counter circuit.

Here, the counter circuit is exemplified with D type flipflop circuits 2114 and 2116 connected in a cascade manner for counting for the toggle of signal /CAS. D flipflop circuit 2114 receives signal /CAS to output a count bit Q0. D type flipflop circuit 2116 receives count bit Q0 to output a count bit Q1.

FIG. 31 is a timing chart for describing the operation of the counter circuit of FIG. 30.

In response to a rising edge of signal /CAS at time t1, count bit Q0 shows a transition. In response to this change of count bit Q0, count bit Q1 is altered. Therefore, count bit Q1 shows a transition at an elapse of a delay time $\Delta t$ from t1.

This time delay $\Delta t$ cannot be neglected when the period of external clock signal CLK is shortened and the toggle period of column address strobe signal /CAS is reduced.

Furthermore, reduction in the period of an external clock signal CLK affects the output waveform of a control pulse generation circuit that is provided to control various circuitry operation in the semiconductor memory device.

FIG. 32 is a block diagram schematically showing a structure of a conventional pulse generation circuit 2200.

Input signal IN is delayed by a time $\tau 1$ by a delay circuit 2222, and then inverted by an inversion circuit 2224 to be applied to one input node of a NAND circuit 2226. NAND circuit 2226 directly receives input signal IN at its other input node to output a pulse signal OUT.

FIG. 33 is a timing chart showing the transition of signal OUT over time when a pulse length $\tau 0$ of input signal IN is greater than delay time $\tau 1$ of delay circuit 2222.

Signal OUT is driven to an L level in response to a rising edge of signal IN, and then driven back to an H level at an elapse of time $\tau 1$. In other words, a control signal pulse having a pulse length of $\tau 1$ is output.

FIG. 34 is a timing chart showing the transition of signal OUT over time when pulse length $\tau 0$ of input signal IN is shorter than the delay time $\tau 1$ of delay circuit 2222.

In this case, the potential level of the other input node of NAND circuit 2226 is altered by the transition of input signal IN before the output level of inversion circuit 2224 shows a transition. Therefore, the pulse length of the output signal OUT becomes equal to time $\tau 0$ which is the pulse length of input signal IN.

When a clock signal or a column address strobe signal /CAS that is generated in synchronization thereof is used as input signal IN, the pulse length of the output pulse signal is reduced as the period of an external clock signal CLK becomes shorter to result in the possibility of insufficient operation control of internal circuitry.

SUMMARY OF THE INVENTION

An object of the present invention is to provide a semiconductor memory device that can have relative increase of a delay time to data output suppressed even when the period of a clock signal by which the semiconductor memory device operates in synchronization is reduced.

Another object of the present invention is to provide a semiconductor memory device that can control the activation timing of an output buffer in optimum when operated upon switching of operation modes.

A further object of the present invention is to provide a high speed operable semiconductor memory device that has a time delay of a counter circuit that operates in synchronization with an external clock signal suppressed when the period of the external clock signal is reduced.

Still another object of the present invention is to provide a semiconductor memory device that can maintain at a sufficient value the pulse length of a pulse signal that controls the operation of internal circuitry even when the period of an external clock signal is reduced.

According to an aspect of the present invention, a semiconductor memory device that can switch between a first mode in which data read out in response to activation of a column address strobe signal that shows transition according to an external clock signal is output during a first period including activation of the column address strobe signal, and a second mode in which readout data is output in a second period after the first period, includes a memory cell array, a column select circuit, a readout amplify circuit, a mode set circuit, a control circuit, and an output buffer.

The memory cell array includes a plurality of memory cells arranged in a matrix of rows and columns. The column select circuit is activated when a column address strobe signal is activated to select a corresponding memory cell column according to a column address signal. The readout amplify circuit amplifies data of a memory cell in a corresponding memory cell column. The mode set circuit provides an operation mode designation signal that designates first and second modes according to an external setting. The control circuit responds to an operation mode designating signal for activating an output buffer activation signal at a delay of a predetermined time period from activation of a column address strobe signal when in the first mode, and for activating the output buffer activation signal in response to detection of initiation of the second period of the column address strobe signal in the second mode. The output buffer receives an output of the readout amplify circuit to be rendered active in response to an output activation signal to provide a corresponding data.

According to another aspect of the present invention, a semiconductor memory device includes a control circuit, a memory cell array, a column select circuit, a readout amplifier circuit, an output buffer, and a write circuit.

The control circuit receives an external control signal including a column address strobe signal to control the read and write operations of the semiconductor memory device. The memory cell array includes a plurality of memory cells arranged in a matrix of rows and columns. The column select circuit is activated when a column address strobe signal is activated to select a corresponding memory cell column according to a column address signal. The readout amplify circuit amplifies data of a memory cell of a corresponding memory cell column. The output buffer is controlled by the control circuit to receive an output of the readout amplify circuit and provide corresponding data. The write circuit receives an external write data, and is controlled by the control circuit to provide write data to a corresponding memory cell in a memory cell column selected by the column select circuit. The control circuit renders the write circuit inactive during activation of the output buffer.

According to another aspect of the present invention, a semiconductor memory device that operates in synchronization with an external clock signal includes a memory cell array, a column select circuit, a control circuit, and a write circuit.

The memory cell array includes a plurality of memory cells arranged in a matrix of rows and columns. The column select circuit is activated when a column address strobe signal is activated to select a corresponding memory cell column according to a column address signal. The control circuit responds to an external control signal including a column address strobe signal and a write enable signal to output a write control signal. The write circuit receives an external write data and responds to a write control signal to provide write data to a corresponding memory cell of a memory cell column selected by the column select circuit. The control circuit includes a latch circuit responsive to designation of a write operation by a column address strobe signal and a write enable signal to maintain a write designating signal at an active state, and a pulse generation circuit responsive to activation of the write designating signal for providing a write control signal having a predetermined pulse length. The latch circuit is reset according to activation of the write control signal.

Therefore, a main advantage of the present invention is that the access time in the second mode can be reduced by virtue of a structure in which the output buffer is activated in response to initiation of the second period of a column address strobe signal where readout data is output in the second mode and in which the output buffer is activated at an elapse of a predetermined time delay from activation of the column address strobe signal in the first mode during operation switching between the first and second modes.

Another advantage of the present invention is that erroneous data writing caused by noise during operation of the output buffer is prevented since the write circuit is inactivated during activation of the output buffer.

A further advantage of the present invention is that the circuit providing output of a write control signal is not reset prior to output thereof by virtue of a structure in which reset of the signal level of the write control signal designating a write operation is effected per se.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 32 is a block diagram schematically showing a structure of a conventional pulse signal generation circuit 2200.

FIGS. 33 and 34 are first and second timing charts, respectively, for describing an operation of pulse signal generation circuit 2200.

DESCRIPTION OF THE PREFERRED EMBODIMENTS

FIRST EMBODIMENT

Figure 1:
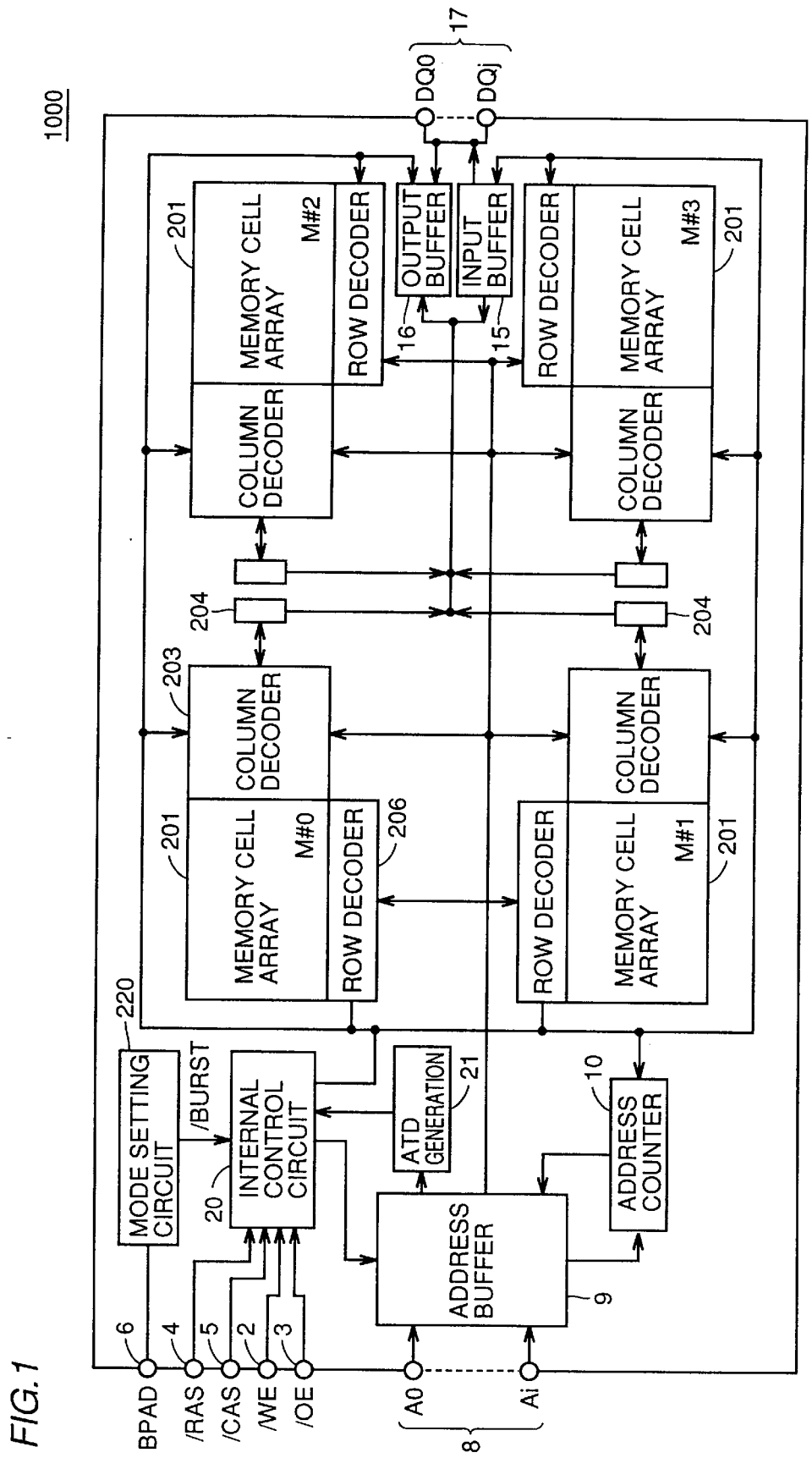
FIG. 1 is a block diagram schematically showing a structure of a semiconductor memory device 1000 according to a first embodiment of the present invention.

FIG. 1 schematically shows a dynamic type semiconductor memory device 1000 according to a first embodiment of the present invention.

Dynamic type semiconductor memory device 1000 includes an internal control circuit 20 receiving external control signals /WE, /OE, /RAS and /CAS provided via external control signal input terminals (nodes) 2–5, memory cell array blocks M#0–M#3 in which memory cells are arranged in a matrix of rows and columns, an address buffers 9 receiving external address signals A0–Ai provided via an address signal input terminal (node) 8 for generating an internal row address signal and an internal column address signal under control of internal control circuit 20, an address counter 10 for generating an internal column address signal in a readout operation of mode 2 under control of internal control circuit 20, an ATD generation circuit 21 detecting transition of an address signal for generating an ATD signal (address transition detection signal) according to an output from address buffer 9, and a row decoder 206 provided corresponding to each memory cell array block 201 for decoding an internal row address signal provided from address buffer 9 to select a row (word line) in memory cell array 201.

Signal /WE provided to external control signal input terminal 2 is a write enable signal designating data writing. Signal /OE applied to external control signal input terminal 3 is an output enable signal designating data output. Signal /RAS applied to external control signal input terminal 4 is a row address strobe signal that initiates an internal operation of the semiconductor memory device and that determines the activation period of the internal operation. During activation of signal /RAS, circuitry such as row decoder 206 that relates to the operation of selecting a row in memory cell array block 201 is rendered active.

Signal /CAS applied to external control signal input terminal 5 is a column address strobe signal to render circuitry that selects a column in memory cell array block 201 active.

Semiconductor memory device 1000 further includes a column decoder 203 activated under control of internal control circuit 20 to decode an internal column address signal from address buffer 9 to generate a column select signal that selects a column in memory cell array block 201, a sense amplifier (which will be shown in FIG. 2) that detects and amplifies data of a memory cell connected to a selected row in memory cell array block 201, an input/output circuit 204 responsive to a column select signal from column decoder 203 for connecting a selected column in memory cell array block 201 to an internal data bus, an input buffer 15 under control of internal control circuit 20 for generating and transmitting to the internal data bus internal write data from external write data DQ0–DQa provided to data input/output terminal 17 during data writing, and an output buffer 16 under control of internal control circuit 20 for generating and providing to data input/output terminal 17 internal data readout data DQ0–DQj from the internal readout data on the internal data bus in data readout.

Input buffer 15 is activated when signals /WE and /CAS both attain an active state of an L level to generate internal write data. Output buffer 16 is activated in response to activation of output enable signal /OE.

Dynamic type semiconductor memory device 1000 further includes a mode set circuit 220 responsive to a set signal provided via an external control signal input terminal 6 for providing a signal /BURST designating an internal operation mode.

Figure 2:
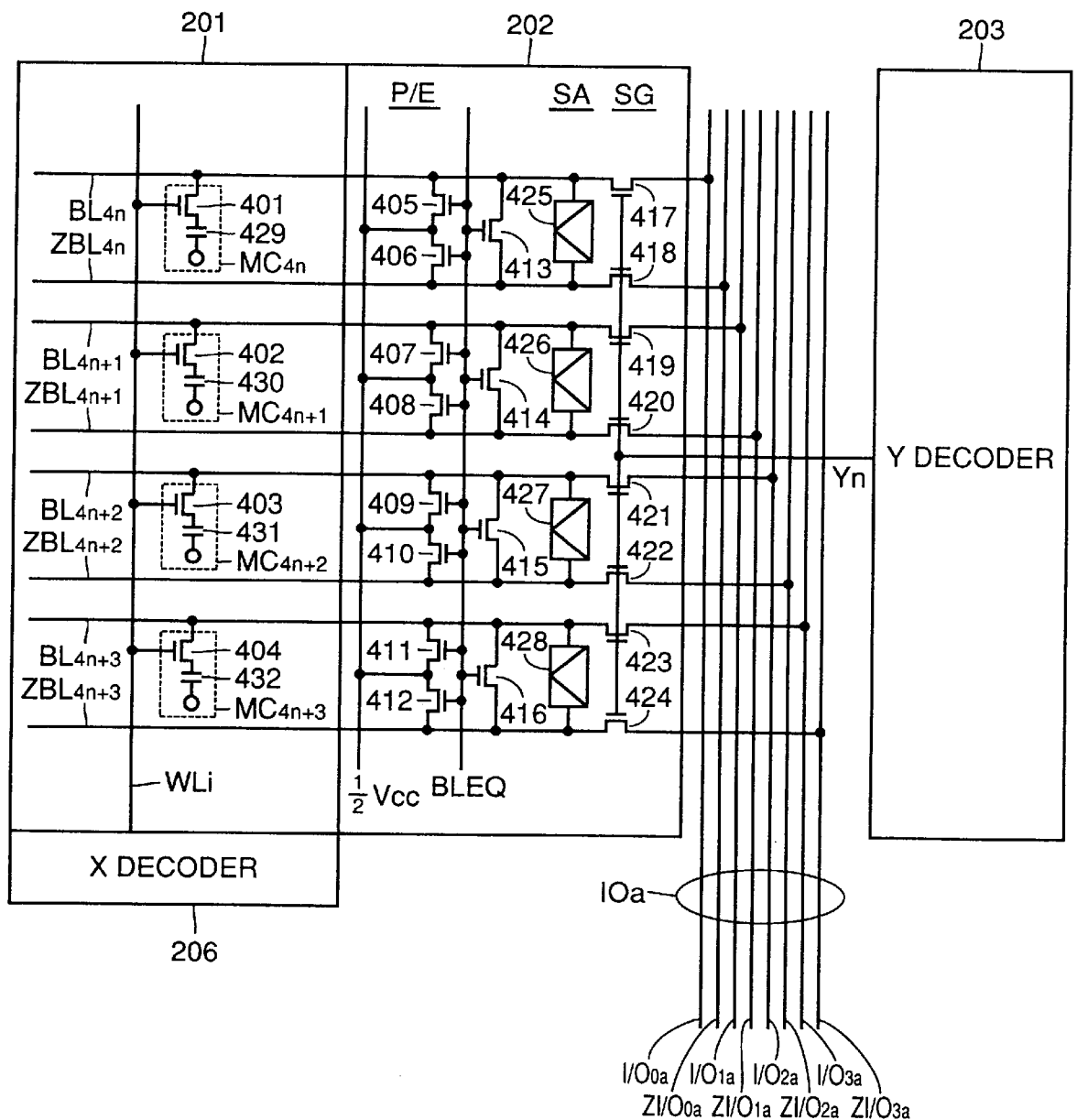
FIG. 2 shows a structure of an array control unit of the semiconductor memory device of FIG. 1 according to the first embodiment of the present invention.

FIG. 2 specifically shows one memory cell array block M#0 of FIG. 1 and array control circuit 202 arranged corresponding thereto.

Referring to FIG. 2, memory cell array block 201 includes a plurality of memory cells MC arranged in a plurality of rows and columns. In FIG. 2, four bits of memory cells MC4n–MC4n+3 that are selected at the same time are typically shown.

Memory cell array block 201 further includes a pair of bit lines BL and ZBL arranged corresponding to each column of memory cells, and a plurality of word lines WL arranged corresponding to each row of memory cells.

Four pairs of bit lines BL4n, ZBL4n–BL4n+3, ZBL4n+3, and one word line WLi are typically shown in FIG. 2.

Data signals complementary to each other are transmitted on bit line pair BL (BL4n–BL4n+3) and bit line ZBL (ZBL4n–ZBLn+3).

A memory cell MC4n is disposed corresponding to a crossing of word line WLi and bit line BL4n.

Memory cell MC4n includes a memory cell capacitor 429 for storing information, and an access transistor 401 formed of an N channel MOS transistor rendered conductive in response to a signal potential on word line WLi for connecting capacitor 429 to bit line BL4n.

Each of the other memory cells MC4n+1, –MC4n+3 has a similar structure.

Array control circuit 202 includes a precharge/equalize circuit P/E for precharging and equalizing the potentials of bit lines BL and ZBL at a predetermined level (Vcc/2:Vcc is an operating power supply potential), a sense amplifier band SA for amplifying differentially the signal potentials of the pair of bit lines BL and ZBL, and a select gate band SG for connecting four pairs of bit lines BL4n, ZBL4n–BL4n+3, ZBL4n+3 to an internal input/output bus IOa according to a column select signal Yn from Y decoder 203.

The precharge/equalize circuit of the pair of bit lines BL4n, ZBL4n includes n channel MOS transistors 405 and 406 for transmitting an intermediate potential Vcc/2 to bit lines BL4n and ZBL4n, respectively, during conduction, and an n channel MOS transistor 413 for rendering bit lines BL4n and ZBL4n electrically conductive during conduction.

The same applies for the other pairs of bit lines BL4n+1, BL4n+1–BL4n+3, ZBL4n+3.

N channel MOS transistors 405–416 conduct when a precharge designating signal BLEQ attains a high level. Bit line precharge designating signal BLEQ is rendered to an active state of a high level during standby (or during a reset operation:during inactivation of row address strobe signal /RAS) of the semiconductor memory device.

Sense amplifier band SA includes a plurality of sense amplifiers 425–428 corresponding to each pair of bit lines of BL4n, ZBL4n–BL4n+3, ZBL4n+3.

Select gate band SG includes transfer gates 417 and 418 corresponding to the pair of bit lines BL4n and ZBL4n for connecting these bit lines to data input/output lines I/O0a and ZI/O0a, respectively.

Each of the other pair of bit lines BL4n+1, ZBL4n+1–BL4n+3, ZBL4n+3 has a similar structure.

Thus, data from a memory cell connected to a word line WLi selected by a word line drive signal from X decoder 206 is amplified by sense amplifiers 425 and 428.

In response to the potential of column select line Yn from Y decoder 203 attaining an H level indicating a selected state, each bit line pair is connected to a corresponding IO line pair by select gate SG.

Figure 3:
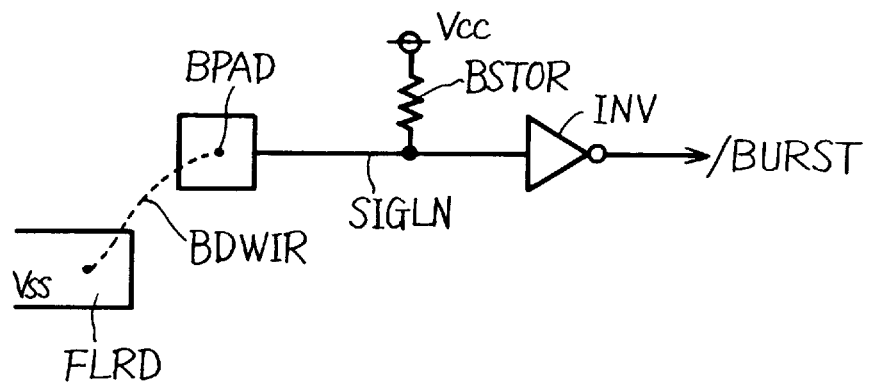
FIG. 3 is a block diagram schematically showing a structure of a mode set circuit 220.

Referring to FIG. 3 showing an example of mode set circuit 220 of FIG. 1, a signal SIGNN is connected to a bonding pad BPAD, and also to a power supply node Vcc via a resistor RASTOR of high resistance.

Signal line SIGNN is connected to an input portion of an inverter INV. An operation mode designating signal /BURST is output from inverter INV. When this operation mode designating signal /BURST attains an H level, a readout operation of mode 1 (for example, a high speed page mode) is designated. When operation mode designating signal /BURST is set to an L level, a readout operation of mode 2 (for example, a pipe line burst mode 2) is specified.

Setting of the potential level of signal /BURST is effected by the connection of a bonding wire BDWIR between bonding pad BPAD and frame lead FLRD supplying ground potential Vss.

When bonding pad BPAD and frame lead FLRD are connected by bonding wire BDWIR, signal line SIGLN is fixed at an L level. Signal /BURST is driven to an H level by inverter INV, whereby a read out operation of mode 1 is specified.

When there is no bonding wire BDWIR, signal line SIGLN is set to an H level by high-resistance resistor RSTOR. In this case, signal /BURST is driven to an L level, whereby a readout operation of mode 2 is specified.

The structure of the operation mode set circuit in FIG. 3 is only by way of example, and a structure may be employed wherein an operation mode designating signal /BURST is generated according to the presence of a bonding wire between a bonding pad and a frame lead supplying a power supply voltage. In this case, resistor RSTOR is connected between ground node and signal line SIG. Alternatively, a structure may be employed wherein the potential level of signal /BURST is specified by programming a fuse element or by mask wiring.

Figure 4:
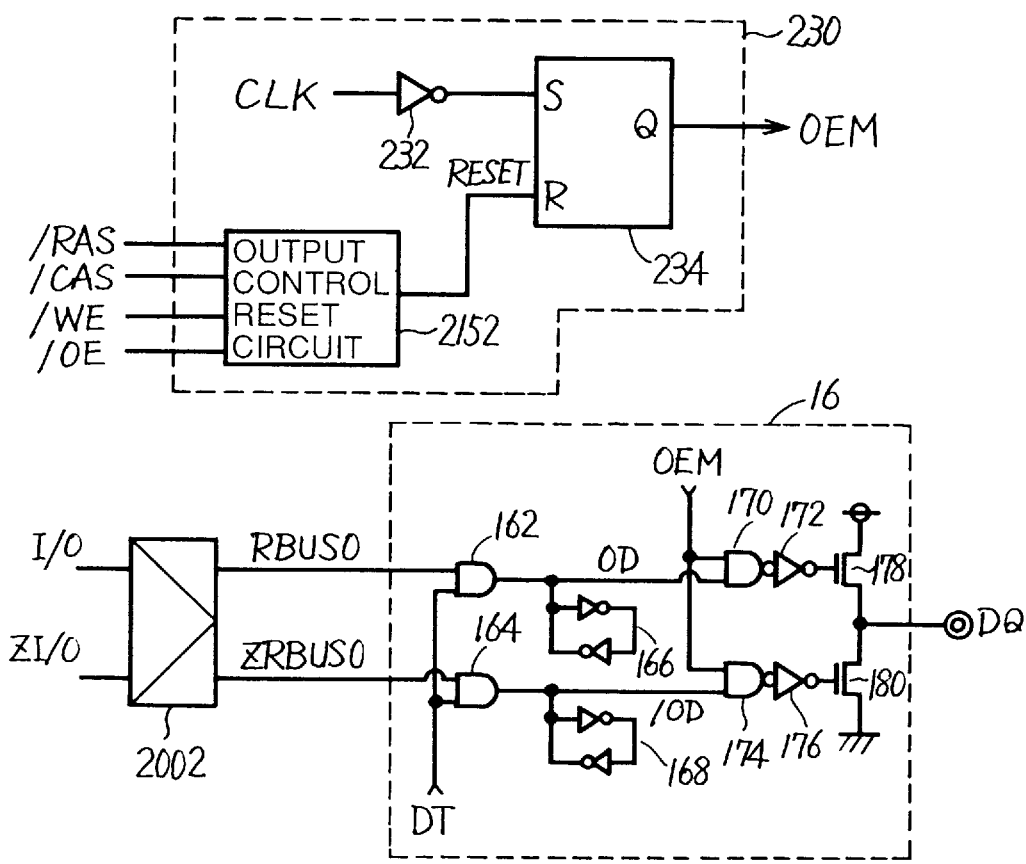
FIG. 4 is a block diagram schematically showing a structure of a data output buffer and an output buffer control circuit of the first embodiment.
Figure 25:
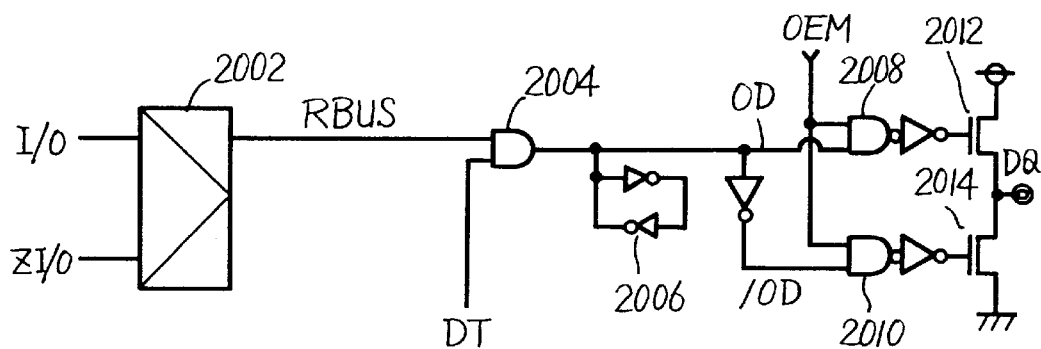
FIG. 25 is a block diagram schematically showing a structure of a conventional data output buffer 2000.
Figure 26:
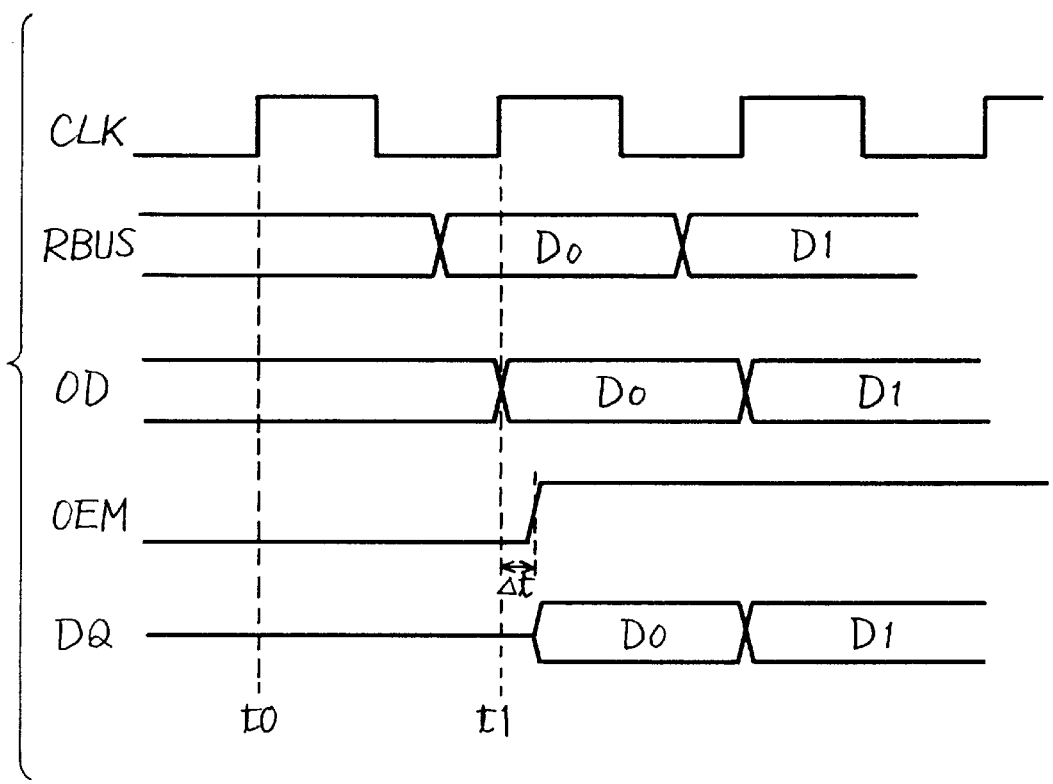
FIG. 26 is a timing chart for describing an operation of data output buffer 2000.

FIG. 4 is a block diagram schematically showing a data output buffer and a control circuit of semiconductor memory device 1000 of the first embodiment, which is comparable to FIG. 25.

A generation circuit 230 of an output buffer activation signal OEM includes an output control reset circuit 2152 receiving signals /RAS, /CAS, /WE and /OE for providing a reset signal RESET, an inverter circuit 232 receiving clock signal CLK for providing an inverted signal thereof, and an SR flipflop circuit 232 receiving an output of invertor circuit 232 as a set signal and signal RESET as a reset signal for providing signal OEM.

Therefore, OEM generation circuit 230 provides signal OEM of an H level in response to a falling edge of clock signal CLK when any of signals /RAS, /CAS, /WE and /OE attains an active state and reset signal RESET attains an L level.

Following amplification of readout data by differential amplify circuit 2202 transmitted through the pair of IO lines I/O and ZI/O, output buffer 16 receives the readout data transmitted through complementary read data buses RBUS0 and ZRBUS0 for providing corresponding data to data input/output terminal DQ.

Output buffer 16 includes AND gates 162 and 164 rendered conductive upon receiving signal DT, latch circuits 166 and 168 receiving outputs of AND gates 162 and 164, respectively, and maintaining the potential level thereof, NAND circuits 170 and 174 activated in response to activation of signal OEM, and receiving outputs of latch circuits 166 and 168, respectively, for driving corresponding inverter circuits 172 and 176, respectively, and N channel MOS transistors 178 and 180 driven by inverter circuits 172 and 176, respectively, and rendered conductive. N channel MOS transistors 178 and 180 are connected in series between power supply potential Vcc and ground potential Vss. The node thereof is connected to data input/output terminal DQ.

Figure 5:
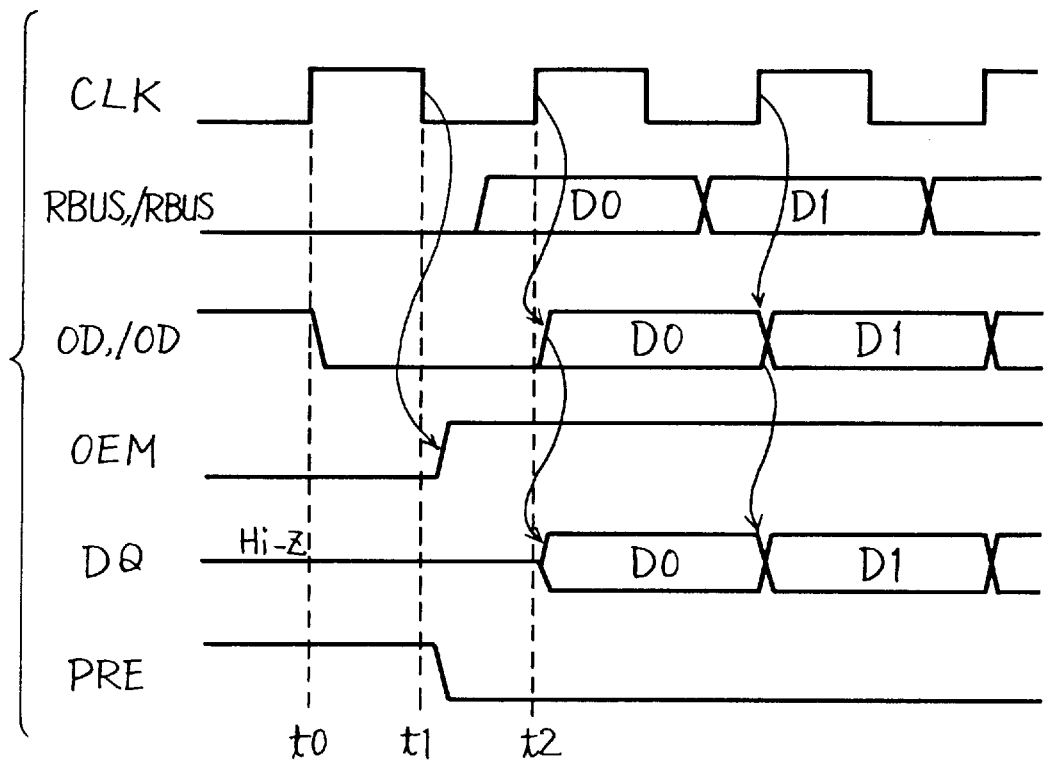
FIG. 5 is a timing chart for describing an operation of the output buffer of FIG. 4.

FIG. 5 is a timing chart for describing operations of OEM generation circuit 230 and data output buffer 16 shown in FIG. 4.

A case where data is accessed at a rising edge of clock signal CLK at time t0 will be described hereinafter. It is assumed that read data buses RBUS0 and /RBUS0 both attain an L level when data is not read out.

When clock signal CLK attains an H level at time t0, data latch circuits 166 and 168 both maintain the L level, and the level of inputs OD and /OD of output buffer 16 attain the L level.

When signals OD and /OD both attain an L level, N channel MOS transistors 178 and 180 are both turned off regardless of the level of signal OEM, and output terminal DQ maintains its high-impedance state.

Data Q0 accessed at a rising edge of clock signal CLK at time t0 is read out to read data buses RBUS0 and /ZRBUS0 within one clock period.

At time t1 which is an elapse of a half period from the rise of clock signal CLK at time t0, signal OEM is driven to an H level.

In contrast to the conventional data output buffer shown in FIG. 25, signal OEM can be driven to an H level at a timing prior to the rising edge of clock signal CLK from which data output is initiated. This is because signals OD and /OD both attain an L level at this time point.

At time t2 which is the next rising edge of signal CLK, signal DD is pulled up to an H level, and AND gates 162 and 164 attain an open state. In response, data D0 read out to read data buses RBUS0 and ZRBUS0 are maintained in data latches 166 and 168. In response to signals OD and /OD held in data latches 166 and 168, N channel MOS transistors 178 and 180 attain a conductive state or a non-conductive state, respectively, whereby corresponding data signal is provided to data input/output terminal DQ.

Since this structure of complementary read data buses is not affected by delay time Δt from the rise of signal OEM such as that shown in FIG. 25, the access time can be reduced.

SECOND EMBODIMENT

Figure 6:
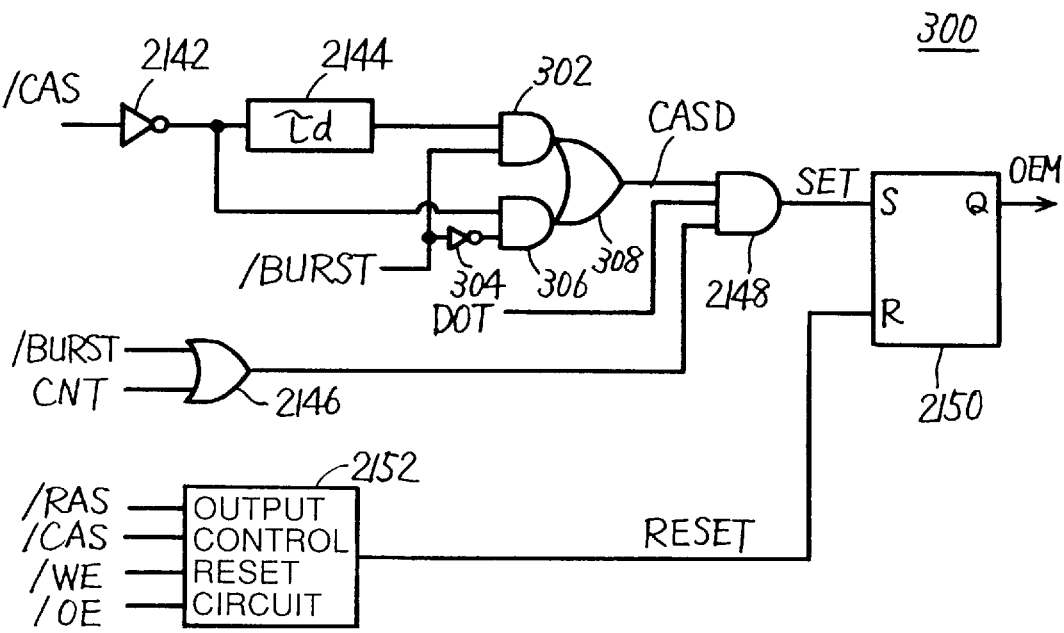
FIG. 6 is a block diagram schematically showing a structure of an OEM generation circuit 300 according to a second embodiment of the present invention.
Figure 27:
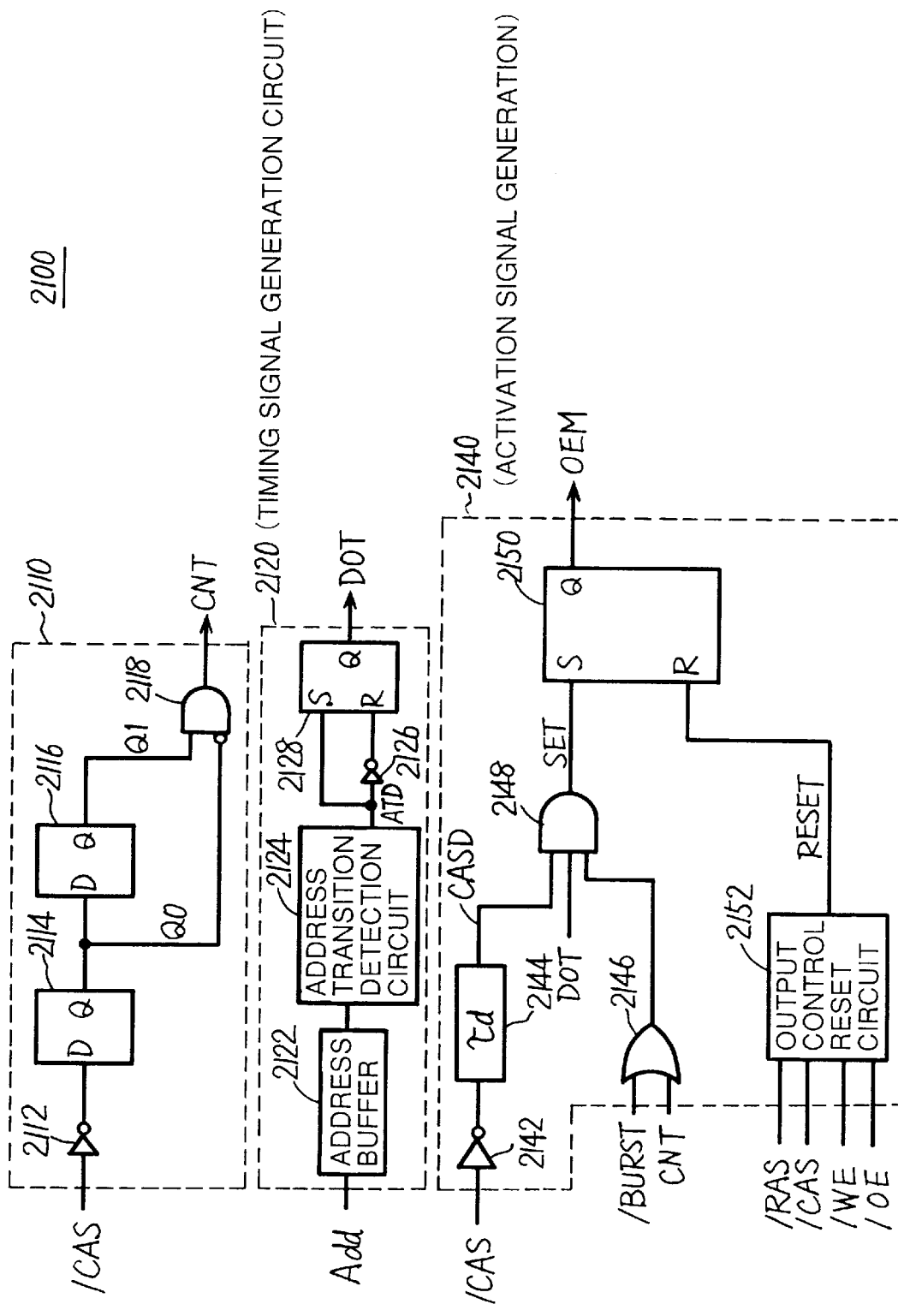
FIG. 27 is a block diagram schematically showing a structure of a conventional OEM generation circuit 2100.

FIG. 6 shows an activation signal generation circuit 300 of the OEM generation circuit that generates an output buffer activation signal OEM according to a second embodiment of the present invention, and is comparable to activation signal generation circuit 2140 shown in FIG. 27.

Activation signal generation circuit 300 of the second embodiment differs from activation signal generation circuit 2140 of FIG. 27 in that the delay time of internal delay signal CASD generated from column address strobe signal /CAS can be made variable according to the level of signal /BURST.

More specifically, activation signal generation circuit 300 shown in FIG. 6 includes, in addition to the structure of activation signal generation circuit 2140 of FIG. 27, an AND circuit 302 receiving an output of delay circuit 2144 and signal /BURST, an inversion circuit 304 receiving /BURST, an AND circuit 306 receiving an output of inverter circuit 2142 that inverts column address strobe signal /CAS and an output of inversion circuit 304, and an OR circuit 308 that provides the logical sum of AND circuits 302 and 306 as signal CASD.

The remaining elements are similar to those of the structure of activation signal generation circuit 2140 of FIG. 27. Corresponding components have the same reference characters allotted, and their description will not be repeated.

Figure 7:
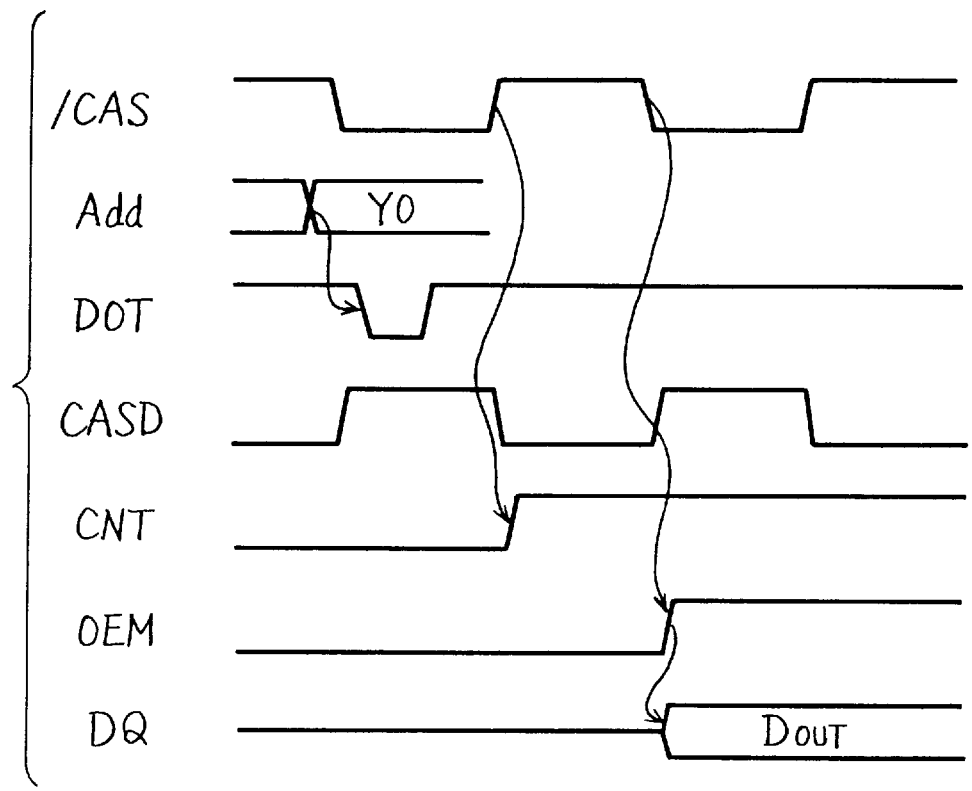
FIG. 7 is a timing chart for describing an operation of OEM generation circuit 300.
Figure 29:
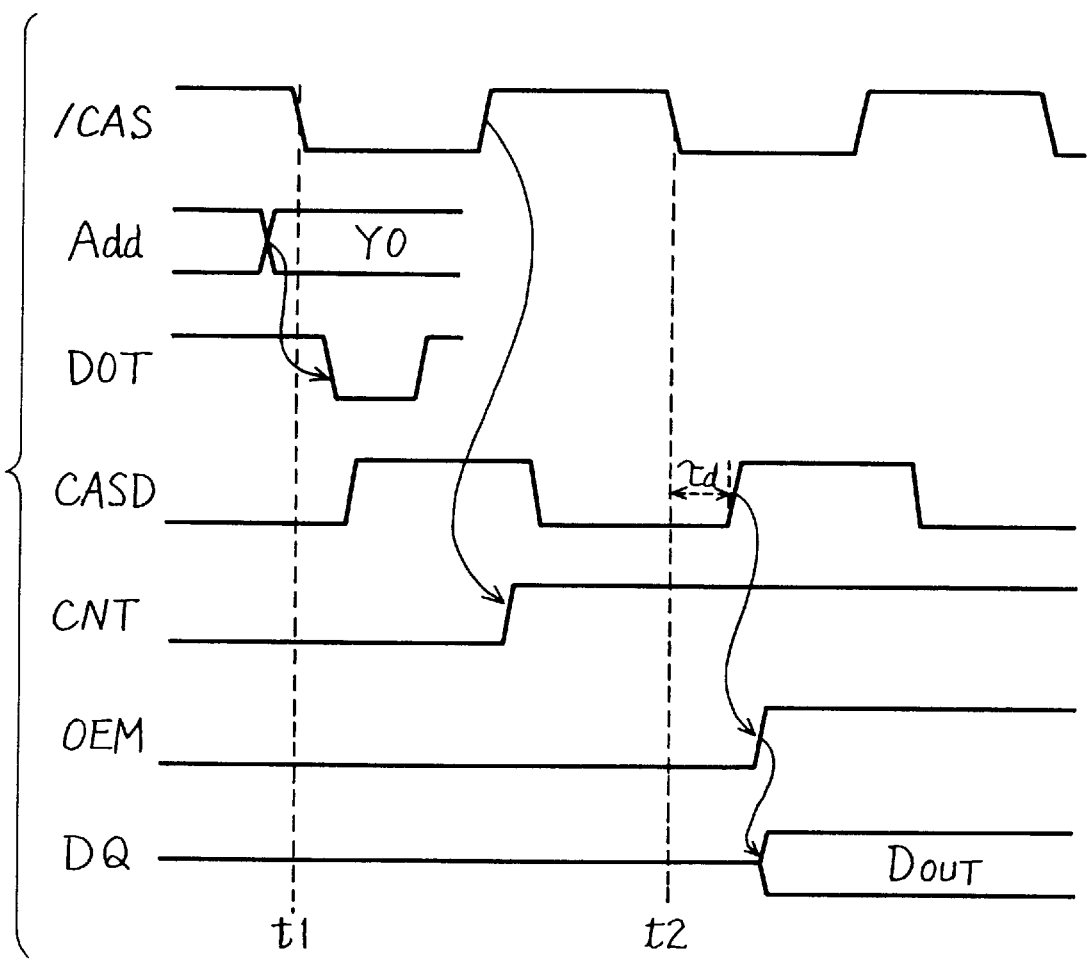
Figure 30:
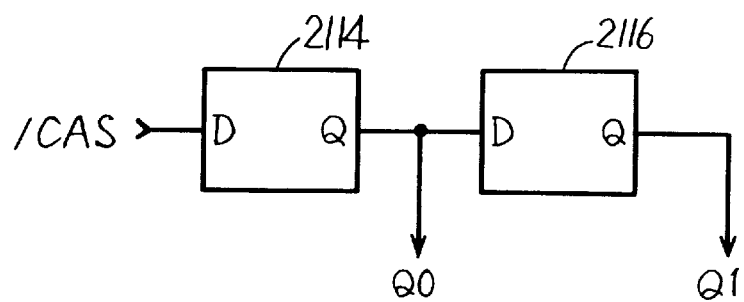
FIG. 30 is a block diagram schematically showing a structure of a conventional counter circuit.
Figure 31:
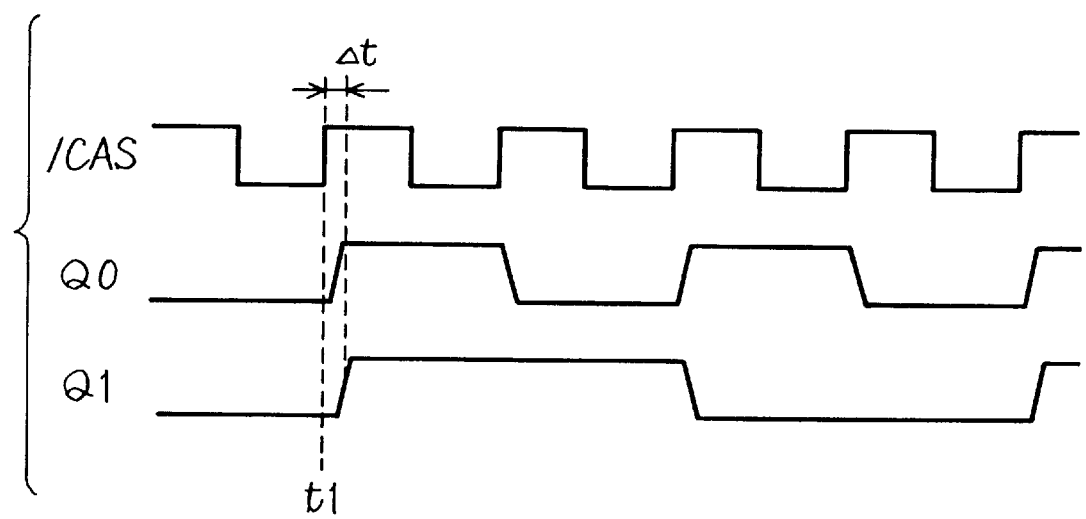
FIG. 31 is a timing chart for describing an operation of the conventional counter circuit.

FIG. 7 is a timing chart for describing a readout operation of mode 2 of activation signal generation circuit 300 of FIG. 6, and is comparable to the timing chart of FIG. 29.

When signal /BURST attains an L level, i.e. when in a read out data operation of mode 2 in activation signal generation circuit 300 of the second embodiment, an inverted version of column address strobe signal /CAS output from inverter circuit 2142 is applied to AND circuit 2148 as signal CASD. In response, the level of output OEM of SR flipflop circuit 2150 is set.

Since data corresponding to address Y0 entered at time t1 is output following the falling edge of column address strobe signal /CAS in a burst mode, signal OEM does not have to be delayed by delay circuit 2144.

Therefore, output buffer activation signal OEM is output according to a signal that does not pass delay circuit 2144 in a readout operation of mode 2.

In response to signal /CAS attaining an active state (L level) at time t2 following input of column address Y0 at time t1 as shown in FIG. 29, signal OEM is rendered active without being delayed by τd. Therefore, the delay time of data output to data input/output terminal DQ is reduced. Therefore, the access time in data readout of mode 2 is shortened.

Figure 28:
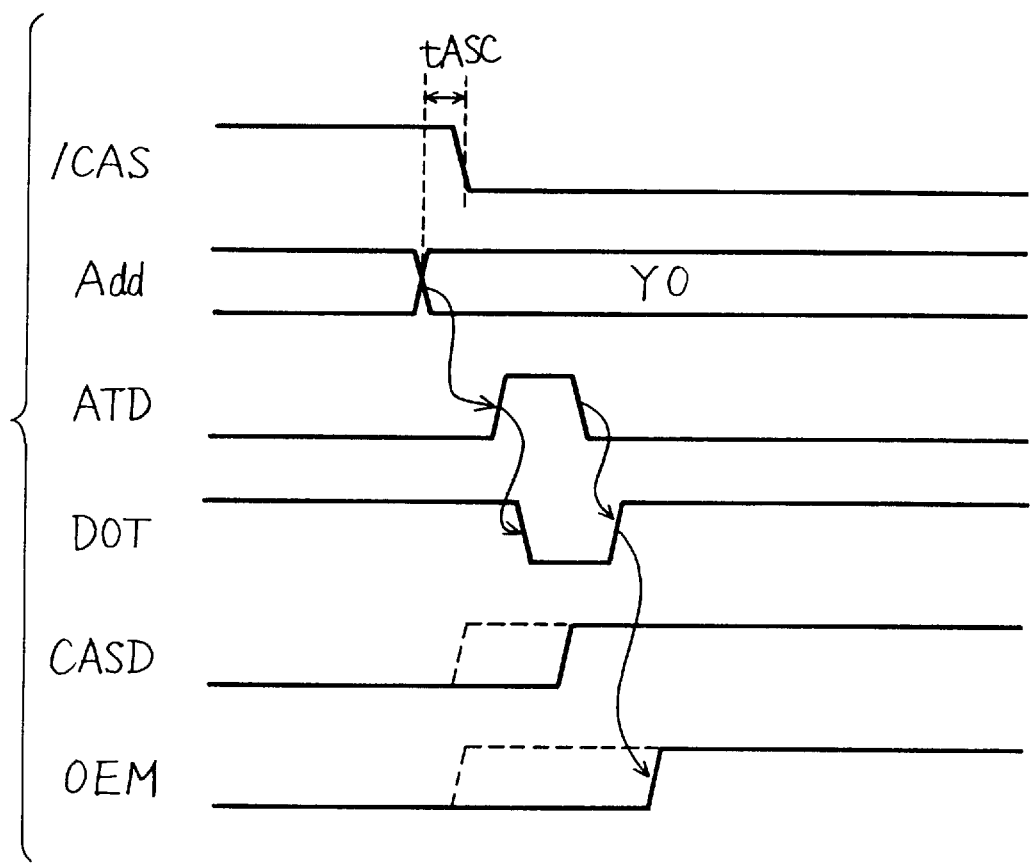
FIGS. 28 and 29 are first and second timing charts respectively, for describing an operation of OEM generation circuit 2100.

In a data readout operation of mode 1, signal /BURST attains an H level and signal CASD is generated according to a signal passing through delay circuit 2144. Therefore, the operation thereof is similar to the conventional case shown in FIG. 28.

THIRD EMBODIMENT

Figure 8:
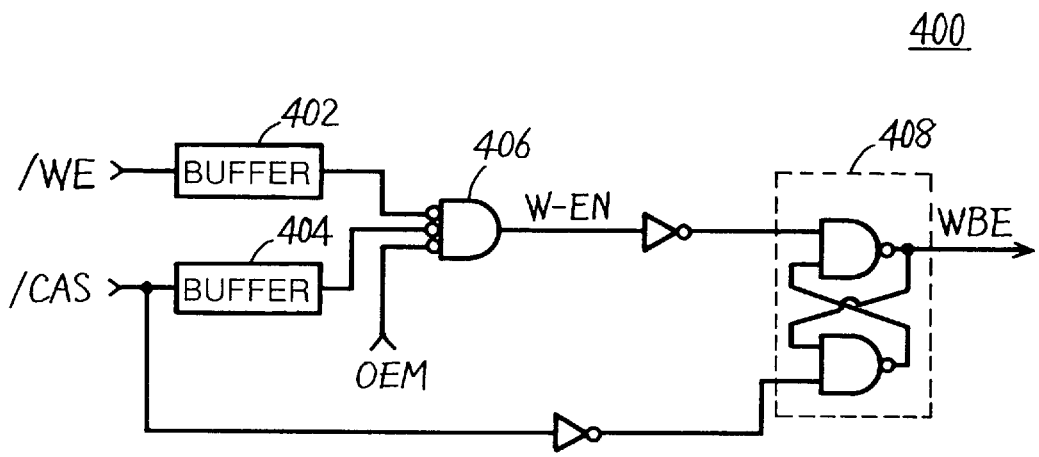
FIG. 8 is a block diagram schematically showing a structure of a write control signal generation circuit 400 according to a third embodiment of the present invention.

A write control circuit 400 according to a third embodiment of the present invention shown in FIG. 8 is included in internal control circuit 20 shown in FIG. 1.

In write control circuit 400, external write enable signal /WE and column address strobe signal /CAS are applied to input buffer circuits 402 and 404, respectively, and output as internal signals ZWEE and ZCASE, respectively.

A write control circuit enable signal W-EN is output from an NOR circuit 406 that receives signals ZWEE and ZCASE and also output buffer activation signal OEM for providing a negative logical sum. The write control circuit of the third embodiment differs from a conventional one in that signal W-EN is also controlled by signal OEM.

In general, there is a possibility of erroneous operation of a write control circuit caused by introduction of noise into signals WE, /CAS, and the like in response to variation in voltage at output terminal DQ in providing readout data.

In contrast, the write control circuit of the third embodiment has a structure in which erroneous write operation is not activated even when noise is mixed into signals /WE, /CAS, and the like when the output buffer circuit is activated in response to activation of signal OEM.

More specifically, the output buffer is activated when signal OEM attains an H level, and signal W-EN is maintained at an L level irrespective of signals /WE and /CAS. Therefore, erroneous operation of the write control circuit to output signal WE is prevented.

Figure 9:
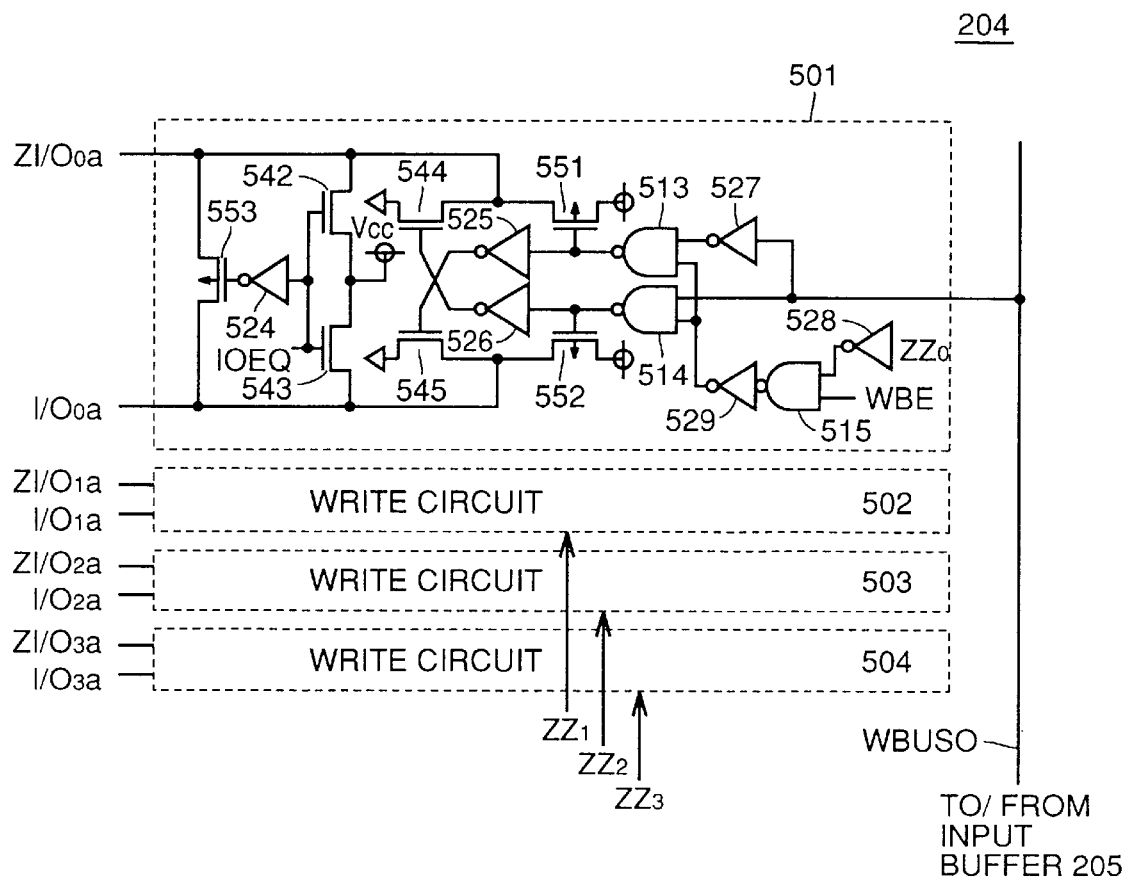
FIG. 9 is a block diagram schematically showing a structure of data write circuit 204 of FIG. 1.

FIG. 9 is a schematic block diagram showing a structure of write circuits 500~504 controlled by signal WE output from the write control circuit shown in FIG. 8, wherein the components related to a write operation of input/output circuit 204 shown in FIG. 1 is particularly depicted.

Referring to FIG. 9, write circuits 501, 502, 503 and 504 are provided corresponding to the four bits of memory cells selected at the same time. Write circuit 501 is activated in response to a bit select signal ZZ0 to carry out transfer of data signal with internal input/output lines I/O0a and ZI/O0a. Write circuit 502 is activated in response to a bit select signal ZZ1 to carry out transfer of a data signal with internal input/output lines I/O1a and ZI/O1a. Write circuit 503 is activated in response to a bit select signal ZZ2 to carry out transfer of a data signal with internal input/output lines I/O2a and ZI/O2a. Write circuit 504 is activated in response to a bit select signal ZZ3 to carry out transfer of a data signal with internal input/output lines I/O3a and ZI/O3a. A write data bus WBUS0 is disposed in common to these circuits 501~504.

Each of write circuits 501~504 has the same structure, and differs only in the applied bit select signal. A specific structure of only write circuit 501 is shown in FIG. 9.

Write circuit 501 includes an inverter 528 for determining bit select signal ZZ0, a NAND gate 515 receiving write driver enable signal WBE and an output signal of inverter 528, an inverter 527 for inverting the signal potential on write data bus line WBUS0, an inverter 529 for inverting an output signal of NAND gate 515, a NAND gate 513 for receiving output signals of inverters 527 and 529, and a NAND gate 514 for receiving the signal potential on write data bus line WBUAS0 and an output signal of inverter 529.

Write driver enable signal WBE is generated by the write control circuit shown in FIG. 8.

Write circuit 501 further includes an inverter 525 for inverting an output signal of NAND gate 513, an inverter 526 for inverting an output signal of NAND gate 514, a p channel MOS transistor 551 for charging internal data input/output line ZI/O0a to the level of power supply potential Vcc when the output signal of NAND gate 513 attains an L level, a p channel MOS transistor 552 for charging internal data input/output line I/O0a to the level of operating power supply potential Vcc when the output signal of NAND gate 514 attains an L level, an n channel MOS transistor 544 for discharging internal data input/output line ZI/O0a to the level of ground potential when the output signal of inverter 526 attains an H level, and an n channel MOS transistor 545 for discharging internal data input/ output line I/O0a to the level of ground potential when the output signal of inverter 525 attains an H level.

Write circuit 501 further includes n channel MOS transistors 542 and 543 rendered conductive when an IO line equalize designating signal IOEQ attains an H level for transmitting a precharge potential of Vcc−Vth (Vth:threshold voltage) to internal data input/output lines ZIO/O0a and I/O0a, and a p channel MOS transistor 513 rendered conductive in response to receiving IO line equalize designating signal IOEQ at its gate via inverter 524 for electrically short-circuiting internal data input/output lines I/O0a and ZI/O0a.

The operation of this write circuit will be described hereinafter.

When bit select signal ZZ0 attains an H level indicating a de-selected state, or when write driver enable signal WDE attains an inactive state of an L level, the output signal of inverter 529 attains an L level, and the output signals of NAND gates 513 and 514 attain an H level.

In this state, MOS transistors 551, 552, 544 and 545 are all turned off. IO line precharge signal IOEQ is pulled up to an H level of an active state at a predetermined timing, whereby internal data input/output lines IO0a and ZI/OO0a are precharged to the H level of Vcc−Vth.

The output signal of inverter 528 is pulled to an H level in response to bit select signal ZZ0 of a low level. Then, in response to write driver enable signal WBE pulled up to an H level of an active state, the output signal of inverter 529 is driven to an H level. As a result, NAND gates 513 and 514 function as inverters.

The signal potential on write data bus line WBUS0 is inverted by inverter 527 and applied to NAND gate 513. Therefore, output signals complementary to each other are output from NAND gates 513 and 514.

When the output signal of NAND gate 513 attains an H level, the output signal of NAND gate 514 attains an L level. Therefore, MOS transistors 544 and 552 are turned on, whereby data of an H level and data of an L level are transmitted onto internal data input/output lines I/OO0a and ZI/OO0a, respectively. Thus, data is written into a selected memory cell.

Since signal WBE attains an inactive state during activation of the output buffer in the third embodiment of the present invention, write circuits 501–504 will not operate erroneously.

FOURTH EMBODIMENT

In the write control circuit of FIG. 8, there is a possibility that a write control signal WBE is not easily generated when the toggle period of signal /CAS is shortened.

In other words, the write control circuit of FIG. 8 has a structure in which reset of the level of signal WBE is effected by column address strobe signal CAS.

If the toggle period of signal /CAS is shortened, the state of flipflop circuit 408 may be reset by signal /CAS prior to the setting of the output level thereof that outputs signal WBE. There is a possibility that signal WBE is not output.

In view of the foregoing, a semiconductor memory device is provided including a write control circuit that has this problem eliminated.

Figure 10:
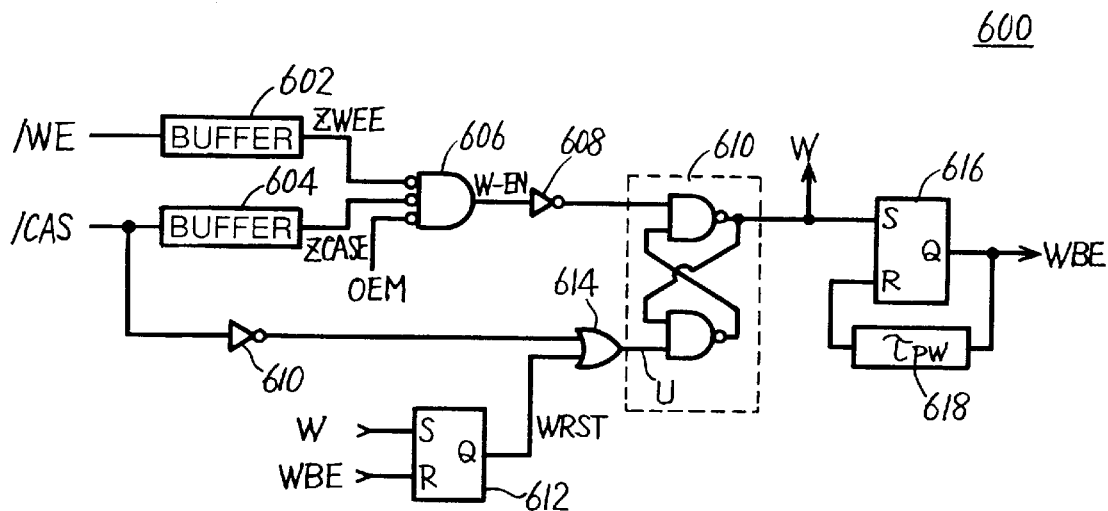
FIG. 10 is a block diagram schematically showing a structure of a write control signal generation circuit 600 according to a fourth embodiment of the present invention.

FIG. 10 is a block diagram showing a structure of such a write control circuit according to a fourth embodiment of the present invention. A circuit configuration can be implemented in which the write control circuit of the fourth embodiment is included in internal control circuit 20 shown in FIG. 1.

The write control circuit of the fourth embodiment differs from write control circuit 400 of the third embodiment in that the reset operation of the SR flipflop circuit providing signal WBE can be effected by its own WBE signal.

More specifically, a write control circuit 600 of the fourth embodiment includes a buffer circuit 602 receiving a write enable signal /WE for providing an internal signal ZWEE, a buffer circuit 604 receiving column address strobe signal /CAS for providing an internal signal ZCASE, an NOR circuit 606 receiving signals ZWEE, ZCASE and OEM for providing signal W-EN, an inverter circuit 608 receiving signal W-EN for providing an inverted signal thereof, an SR flipflop circuit 610 formed of an NAND gate receiving an output of inverter circuit 608 as a set signal and providing signal W, an inverter circuit 601 for providing an inverted version of signal /CAS, an SR flipflop circuit 612 receiving signal W as a set signal and signal WBE as a reset signal for providing a signal WRST, an OR circuit 614 receiving signal WRST and an output of inverter circuit 610 for providing a result of a logical sum operation as a reset signal of SR flipflop circuit 610, an SR flipflop circuit 616 receiving signal W as a set signal for providing signal WBE, and a delay circuit 618 receiving and delaying signal WBE for a predetermined time of τPW for providing the same as a reset signal of SR flipflop circuit 616.

The output node of OR circuit 614 is labeled "U".

Figure 11:
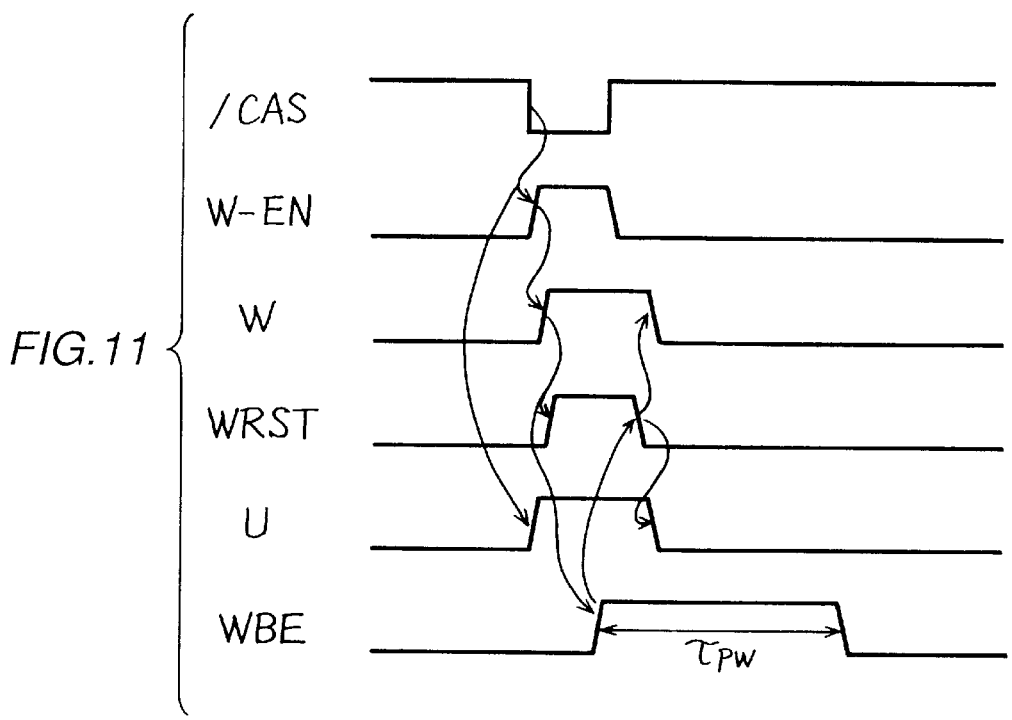
FIG. 11 is a timing chart for describing an operation of write control signal generation circuit 600.

The operation of write control circuit 600 of FIG. 10 will be described with reference to the timing chart of FIG. 11.

When signal /WE attains an active state (L level), NOR circuit 606 responds to a failing edge of signal /CAS to output signal W-EN of an active state (H level). In response, the signal output W of SR flipflop circuit 610 is rendered active, and the level of the outputs of SR flipflop circuits 612 and 616 attains a set state.

The potential level of node U attains an H level in response to a fall of signal /CAS.

Signal WBE attains a set state (H level) in response to activation of signal W. In response, the output level of SR flipflop circuit 612 is reset and signal WRST is pulled down to an L level. In response, the level of signal W and node U are both driven to an L level. More specifically, signal W which is an output of SR flipflop circuit 610 is automatically reset at an elapse of a predetermined time period which is determined by the delay time of circuitry after being activated according to signals /WE and /CAS.

Following activation of signal WBE, the reset signal of SR flipflop circuit 616 is activated at an elapse of τPW which is the delay time determined by delay circuit 618, whereby signal WBE is driven back to the L level.

More specifically, transition of external control signals /WE and /CAS is maintained by SR flipflop circuit 610, whereby signal WBE is output by SR flipflop circuit 616 to effect the reset operation of the SR flipflop circuit providing signal WBE by a delay signal of signal WBE.

Since the reset operation of SR flipflop circuit 610 is also effected by signal WBE, the reset operation of write control circuit 600 per se is effected, not directly by an externally applied signal /CAS, but by the generated signal WBE.

Therefore, the reset operation will not be carried out prior to activation of the output signal WBE even when the toggle period of signal /CAS is shortened.

In other words, write control signal WBE can be generated properly even when the cycle time of signal /CAS is shortened and the activation time period is reduced.

FIFTH EMBODIMENT

There are cases where the specification differs of the set up or hold time of write data according to an externally set operation mode.

In the fifth embodiment, a semiconductor memory device is provided that can have the timing of the set up and hold signals of an externally applied data varied according to the operation mode.

Figure 12:
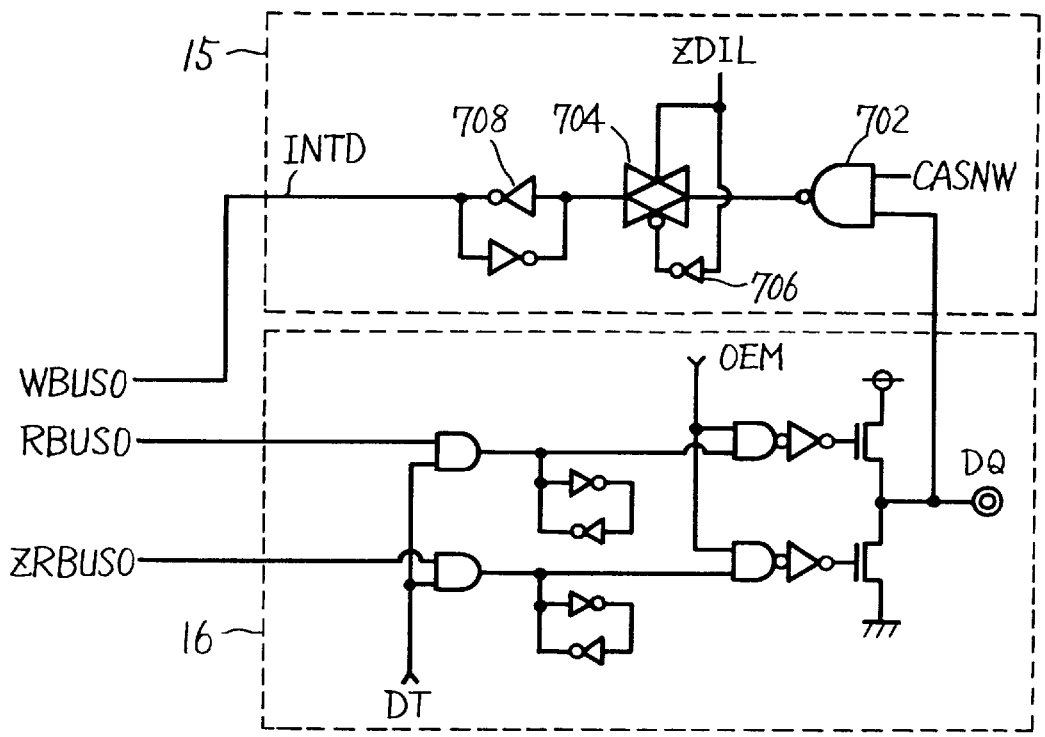
FIG. 12 is a block diagram schematically showing a structure of a data output buffer according to a fifth embodiment of the present invention.

FIG. 12 is a circuit diagram showing the main components of data input buffer 15 and output buffer 16.

The structure of data output buffer 16 is similar to that described with reference to FIG. 4, and their description will not be repeated.

Data input buffer 15 includes an NAND circuit 702 having one input node connected to data input/output terminal DQ and the other input node receiving a signal CASNW, a transmission gate 704 receiving an output of NAND circuit 702, and rendered conductive or non-conductive according to signal ZDIL, and a latch circuit 708 receiving and holding the data output of transmission gate circuit 704 for providing the same as write data INTD to write data bus WBUS0.

Figure 13:
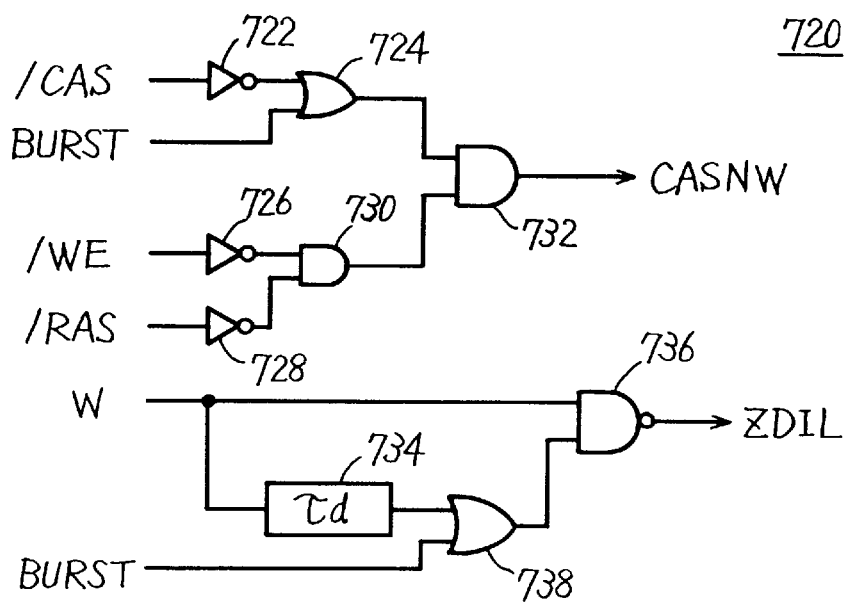
FIG. 13 is a block diagram schematically showing a structure of a data input buffer control signal generation circuit 720.

FIG. 13 shows a structure of an input control circuit 720 that provides signals CASNW and ZDIL shown in FIG. 12. Input control circuit 720 is included in the internal control circuit shown in FIG. 1.

Input control circuit 720 includes an inversion circuit 722 receiving signal CAS, an OR circuit 724 receiving signal BURST designating an operation mode and an output of inversion circuit 722, an inversion circuit 726 receiving signal /WE, an inversion circuit 728 receiving signal /RAS, an AND circuit 730 receiving outputs of inversion circuits 726 and 728, an AND circuit 732 receiving outputs of OR circuit 724 and AND circuit 730 for providing signal CASNW, a delay circuit 734 receiving and delaying for a predetermined time period signal W from the write control circuit shown in FIG. 10 for providing the delayed signal, an OR circuit 738 receiving signal BURST and an output of delay circuit 734, and an NAND circuit 736 receiving signal W and an output of OR circuit 738 for providing signal ZDIL.

The operation thereof will be described.

Figure 14:
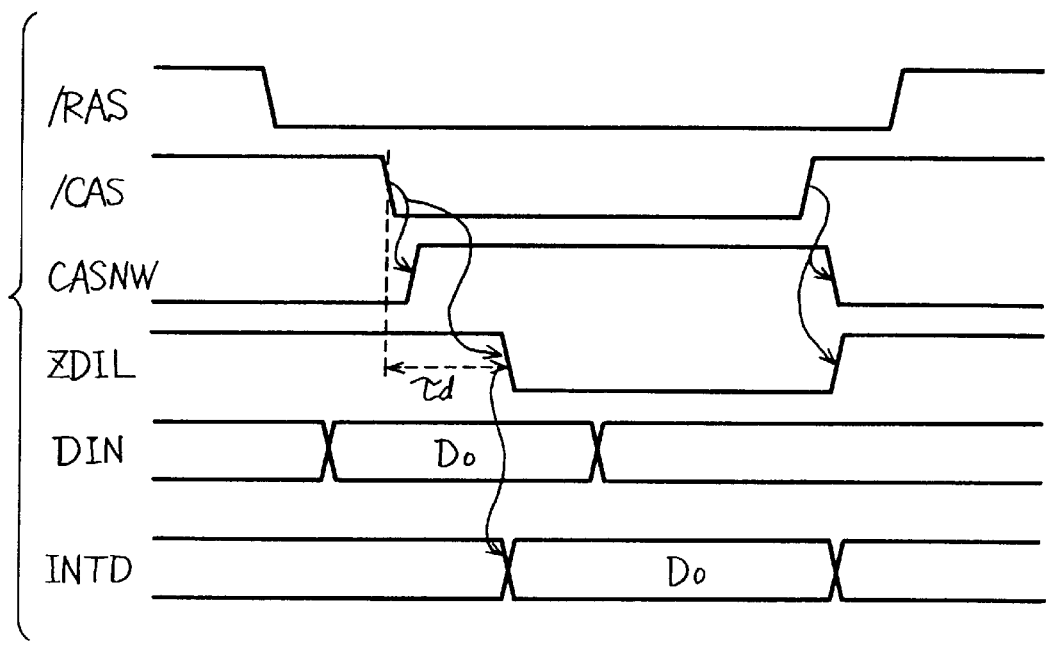
FIGS. 14 and 15 are first and second timing charts, respectively, for describing an operation of data input buffer 15.

FIG. 14 is a timing chart for describing an operation of input buffer 15 in the case where signal BURST attains an L level.

In the following, it is assumed that a write operation is designated, i.e. signal /WE attains an active state of an L level.

At time t0, row address strobe signal /RAS attains an L level. When signal /CAS attains an L level at time t1, set signal CASNW is pulled up to an H level in response to activation of signal /CAS.

As a result, NAND gate 702 is opened.

In response to receiving signal W, signal ZDIL is pulled down to an L level at an elapse of a delay time τt by delay circuit 734. Externally input data DIN is held in latch circuit 708, and write data INTD is output to write data bus WBUS0.

Since input signal DIN is reflected to write data INTD for write data bus WBUS0 only when signal CASNW generated from signal /CAS attains an H level in this operation mode, a delay time of τt is required for signal ZDIL to be driven to an L level and latched in latch circuit 708. There is no problem in this operation when there is margin in the specification of the set up or hold time period of write data. However, there are cases when operation under a more severe specification is required in a mode where a higher rate is required.

Figure 15:
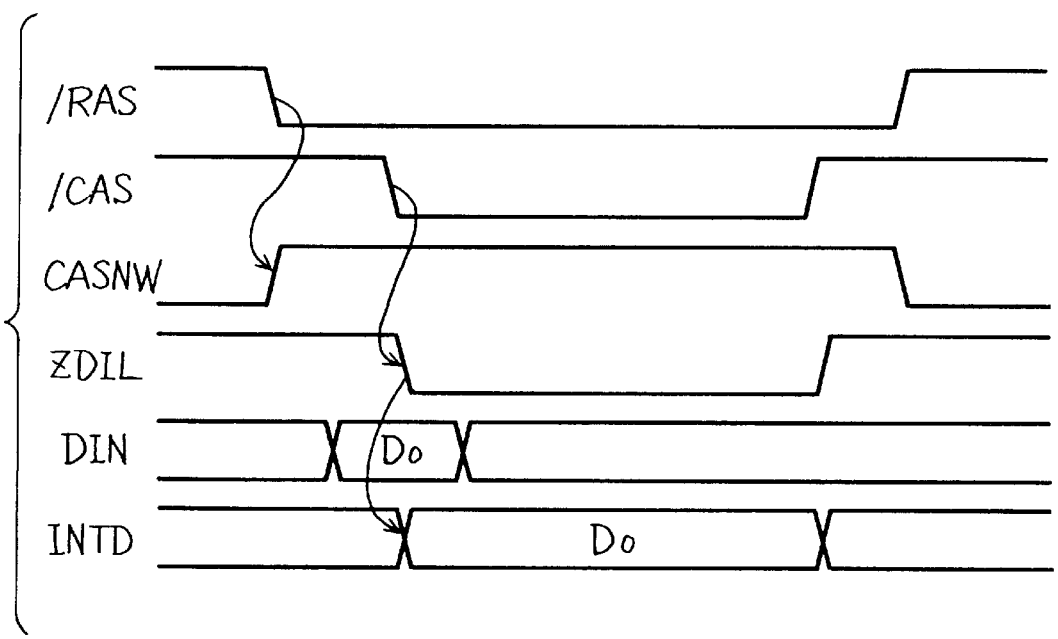

FIG. 15 is a timing chart for describing an operation of input buffer 15 as in the above-mentioned operation mode where signal BURST attains an H level.

Here, signal CASNW is rendered active in response to activation of row address strobe signal RAS.

When signal BURST attains an H level, signal ZDIL is driven to an active state (L level) without be delayed by delay circuit 734 in response to activation of column address strobe signal /CAS. In other words, the timing of externally applied input data DIN provided to write data bus WBUS0 as write data INTD is advanced than the case of FIG. 14.

Thus, a write operation of a higher rate can be accommodated.

Thus, the set up and hold timing of data can be varied according to the operation mode in the fifth embodiment of the present invention.

SIXTH EMBODIMENT

Figure 16:
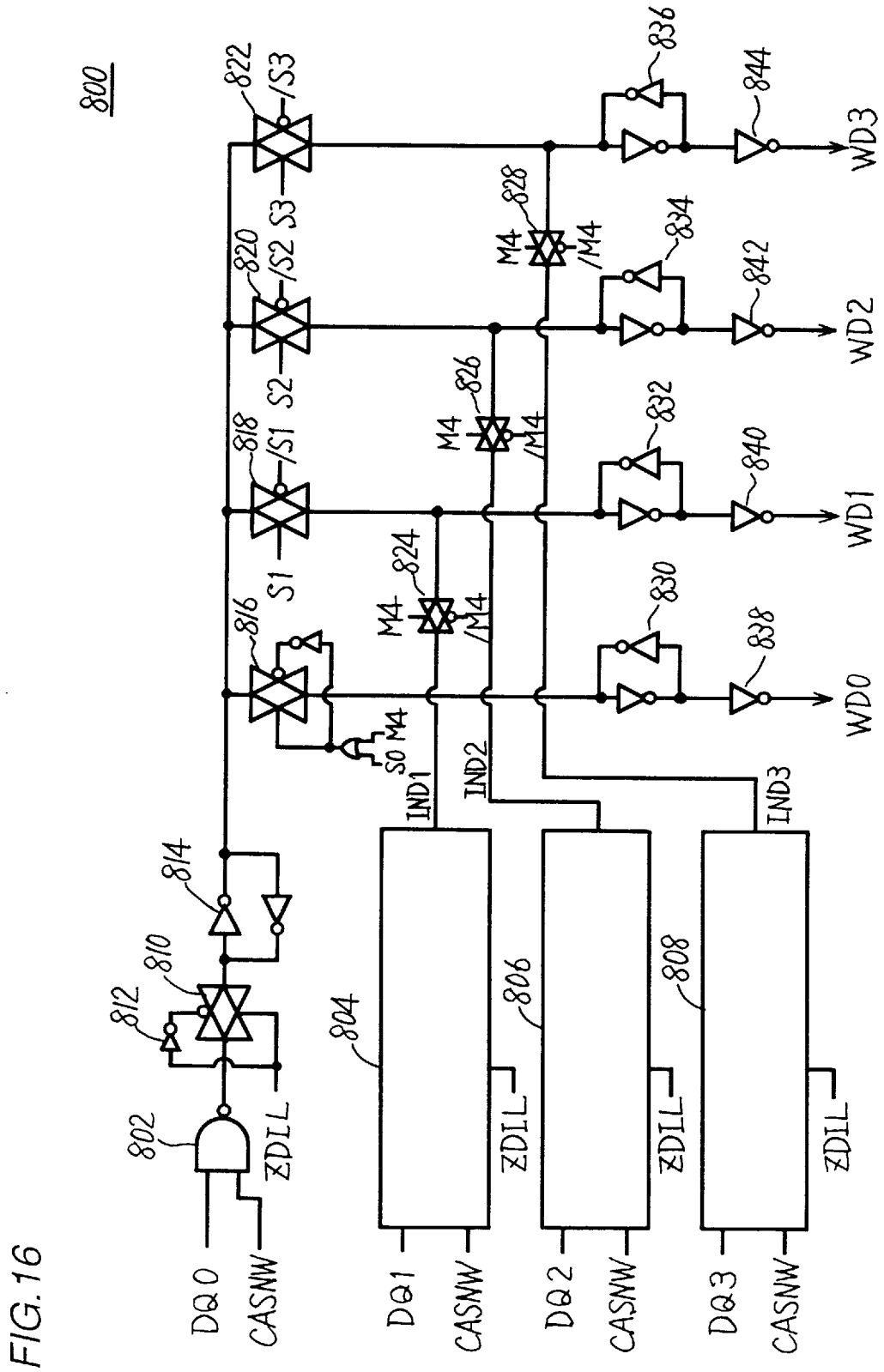
FIG. 16 is a block diagram schematically showing main components of a data input buffer according to a sixth embodiment of the present invention.

FIG. 16 is a block diagram showing a structure of data input buffer 800 according to a sixth embodiment of the present invention.

In the present sixth embodiment, operation can be switched between a first operation mode in which four write data buses WD0, WD1, WD2, and WD3 are respectively driven according to four externally applied data input signal DIN0, DIN1, DIN2, and DIN3 to the four data input terminals, and a second operation mode in which data input/output terminals DQ1~DQ3 are not used, and one of the four write data buses is driven according to signal DIN0 output from data input/output terminal DQ0.

In the first mode in input buffer 800 shown in FIG. 16, signal M4 output from the internal control circuit shown in FIG. 1 attains an H level, and signals S0~S3 all attain an L level. Therefore, four write data buses WD0, WD1, WD2, and WD3 are driven by input data DIN0, DIN1, DIN2, and DIN3 applied to data input/output terminals DQ0~DQ3, respectively.

In the second operation mode, signal M4 output from internal control circuit 20 shown in FIG. 1 attains an L level. Only the selected one of signals S0, S1, S2, and S3 attains an H level so that one of write data buses WD0~WD3 is driven according to data DIN0 applied to data input/output terminal DQ0.

In contrast to FIG. 12 where four of the input buffer circuit shown in FIG. 12 are arranged in parallel, input buffer 800 includes, in addition to latch circuit 814 to which signal ZDIL is input that controls the set up and hold of input data, latch circuit 830~836 corresponding to respective outputs of CMOS transfer gates 816~822, respectively, controlled by signals S0~S4 and signal M4. Each output of latch circuits 830~836 is applied to a corresponding one of write data buses WD0~WD3.

If these latch circuits 830~836 are not provided, all the buses other than the selected write data bus must be driven in order to drive a particular write data bus according to data DIN0 applied to data input/output terminal DQ0. If a structure is not provided in which a de-selected write data bus is also driven due to lack of latch circuits 830~836, the gate inputs of inverter circuits 838~844 driving the write data buses will attain a floating state to induce the possibility of a through current flow thereto.

The provision of latch circuits 830~836 in data input buffer 800 of the sixth embodiment allows a structure in which only the selected write data bus is to be driven, as will be described hereinafter.

For example, when write data bus WD2 is to be driven by input data DIN0 applied to data input/output terminal DQ0, only signal S2 attains an H level, and the other signals of S0, S1, and S3 attain an L level. Therefore, the input gates of invert circuits 838, 840 and 844 will not attain a floating state even when CMOS transfer gates 816, 818 and 822 are turned off by virtue of the presence of corresponding latch circuits 830, 832 and 836.

According to the data input buffer of the present embodiment, only the selected write data bus is driven. Therefore, the current for charging/discharging an unrequired data bus can be suppressed to reduce power consumption.

SEVENTH EMBODIMENT

As described with reference to a data readout operation of mode 2, there are cases where the timing of data output must be determined by counting the number of toggle periods of signal /CAS. In this case, there is a problem of time delay in the transition of data representing the count result comparable to transition of input signal /CAS due to the delay of the signal transmitted through the D type flipflops connected in series, as described in the section of the background art.

The present embodiment relates to a counter circuit that can have such time delay suppressed.

Figure 17:
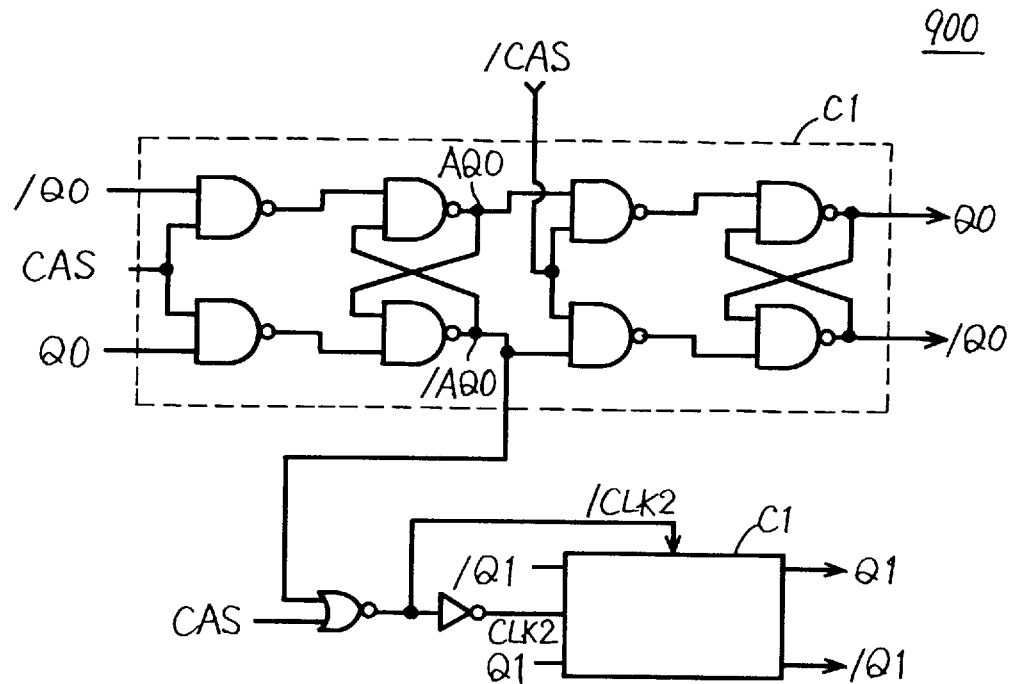
FIG. 17 is a block diagram schematically showing a structure of a counter circuit 900 according to a seventh embodiment of the present invention.

FIG. 17 is a circuit diagram showing a structure of a counter circuit 900 according to a seventh embodiment of the present invention.

For the sake of simplification, a structure of a counter circuit where data readout is initiated at the second period of a toggle of signal /CAS will be described. However, a structure in which readout is carried out after more toggle periods of signal /CAS can be accommodated by just connecting the counter circuit of a structure set forth in the following in a cascade manner.

A counter circuit 900 of the seventh embodiment is formed of two stages of a master slave type flipflop circuit C1.

It is to be noted that such a master slave type flipflop circuit C1 is not merely cascade-connected in two stages, and the output result of the master portion of the first stage serves as the input to the master slave type flipflop circuit of the subsequent stage.

In other words, the master slave type flipflop circuit of the first stage in counter circuit 900 has its master portion operated according to signal CAS, and its slave portion operated according to signal /CAS.

The master slave type flipflop circuit of the second state has its master portion operated according to signal CLK2 which is a logical sum signal of output /AQ0 of the master portion of the first stage and signal CAS, and its slave portion driven according to signal /CLK2 which is an inverted version of signal CLK2.

Figure 18:
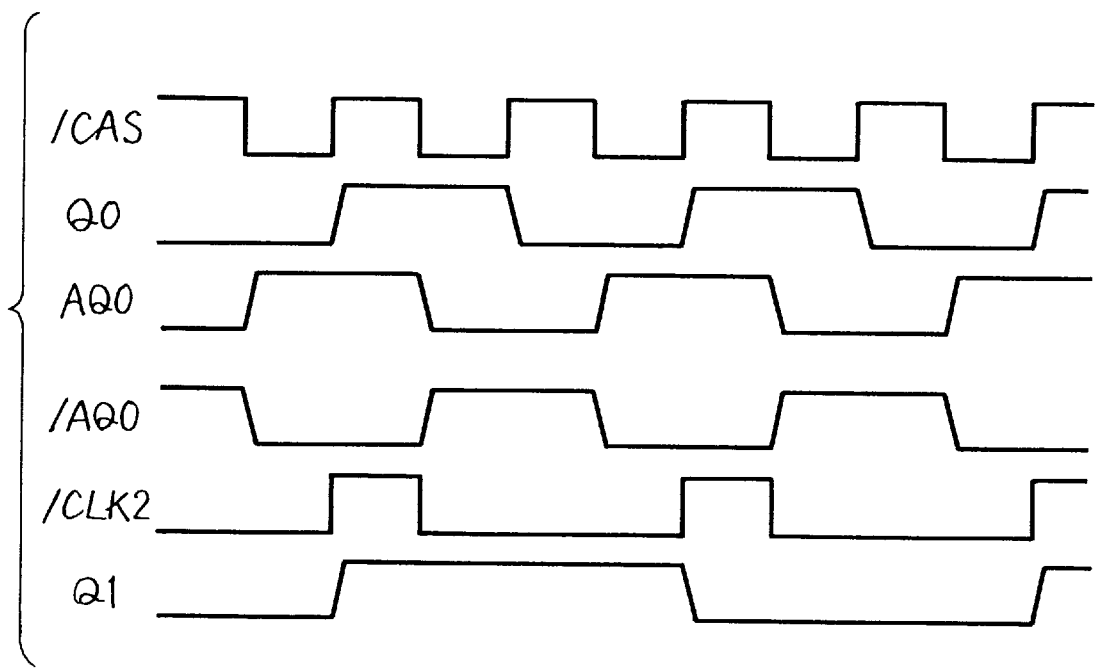
FIG. 18 is a timing chart for describing an operation of counter circuit 900.

FIG. 18 is a timing chart for describing an operation of the counter circuit shown in FIG. 17.

The master slave type flipflop circuit of the first stage provides signals Q0 and /Q0. The master portion of the first stage provides an output signal AQ0 in response to a rise of signal /CAS and provides an output signal Q0 in response to a fall of signal /CAS.

Then, outputs Q1 and /Q1 of the master slave type flipflop circuit of the following stage show transition according to a rise of signal /CLK2 which is the NOR output of signal /CAS and signal /AQ0.

In contrast to the conventional case where flipflop circuits are simply connected serially, a flipflop circuit of a subsequent stage can have the level of its output Q1 altered without having to wait for transition of output Q1 of the flipflop circuit of the first stage. Thus, a speedier count operation can be realized.

EIGHTH EMBODIMENT

In a semiconductor memory device that operates in synchronization with an external clock signal, the signal controlling internal circuitry is implemented by a pulse signal that is output according to activation of the external clock signals. For example, a pulse signal includes a column select signal for designating a select operation related to columns, and a write control signal WBE designating the operation of a write circuit in a data writing operation.

As described in the section of the background art, a pulse signal having a sufficient pulse length cannot easily be generated in a conventional pulse generation circuit when the period of an external clock signal is reduced.

In the present embodiment, a pulse generation circuit is provided that can output a pulse signal having a predetermined pulse length independent of the period of an external clock signal.

Figure 19:
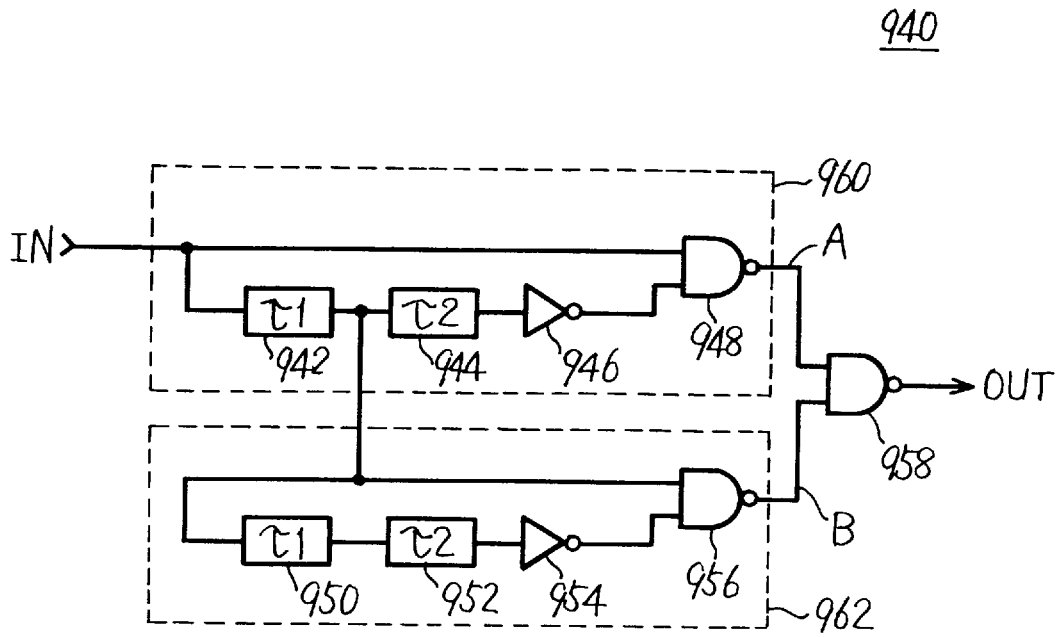
FIG. 19 is a block diagram schematically showing a structure of a pulse signal generation circuit 940 according to an eighth embodiment of the present invention.

Referring to FIG. 19, a pulse signal generation circuit 940 according to an eighth embodiment of the present invention includes a first internal pulse generation circuit 960 receiving an input pulse signal IN for providing a first internal pulse signal, a second internal pulse generation circuit 962 receiving an output of first internal pulse generation circuit 960 for providing a second internal pulse signal, and a NAND circuit 958 receiving and combining outputs A and B of internal pulse generation circuits 960 and 962, respectively, for providing an output pulse OUT.

First internal pulse generation circuit 960 includes a first delay circuit 942 for receiving and delaying input pulse signal IN by a predetermined time $\tau 1$ and providing the delayed signal, a second delay circuit 944 for receiving and delaying output of first delay circuit 942 by a predetermined time $\tau 2$ and providing the delayed signal, a first inversion circuit 946 for inverting an output of second delay circuit 944, and a first NAND circuit 948 for providing a negative AND of input pulse signal IN and an output of first inversion circuit 946.

Second internal pulse generation circuit 962 includes a third delay circuit 950 for receiving and delaying an output of first delay circuit 942 by a predetermined time $\tau 1$ and providing the delayed signal, a fourth delay circuit 952 receiving and delaying an output of third delay circuit 952 for a predetermined time $\tau 2$ and providing the delayed signal, a second inversion circuit 954 for inverting an output of fourth delay circuit 952 and providing the inverted output, and a second NAND circuit 956 for receiving an output of inversion circuit 954 and first delay circuit 942 for providing a negative AND thereof.

As will be described afterwards, NAND circuit 958 provides a negative AND of the outputs of NAND circuits 948 and 956. Therefore, a signal corresponding to a logical sum of the outputs of first and second internal pulse generation circuits 960 and 962 are provided.

Figure 20:
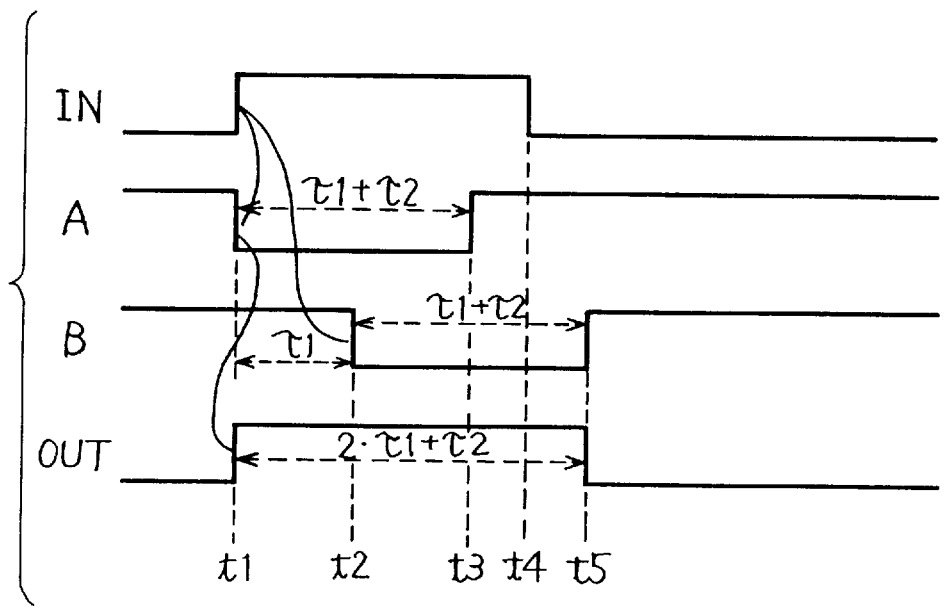
FIG. 20 is a timing chart for describing an operation of a pulse signal generation circuit 940 according to an eighth embodiment of the present invention.

FIG. 20 is a timing chart for describing an operation of the pulse generation circuit of FIG. 19.

In response to a rising edge of input signal IN at time t1, a pulse having a width of time $\tau 1 + \tau 2$ is generated as an output of first internal pulse generation circuit 960.

At an elapse of time $\tau 1$ from the rising edge of input signal IN, a pulse having a pulse width of $\tau 1 + \tau 2$ is generated as an output of second internal pulse generation circuit 962.

Since output OUT is the OR of outputs A and B, OUT has a pulse width $2 \cdot \tau 1 + \tau 1$ from the rising edge of input signal IN.

As shown in FIG. 20, the width of output signal OUT can be maintained at a constant value even when the H level time period of input signal IN becomes shorter than the pulse width of signal OUT as long as the H level period of signal IN is greater than time $\tau 1 + \tau 2$.

NINTH EMBODIMENT

Figure 21:
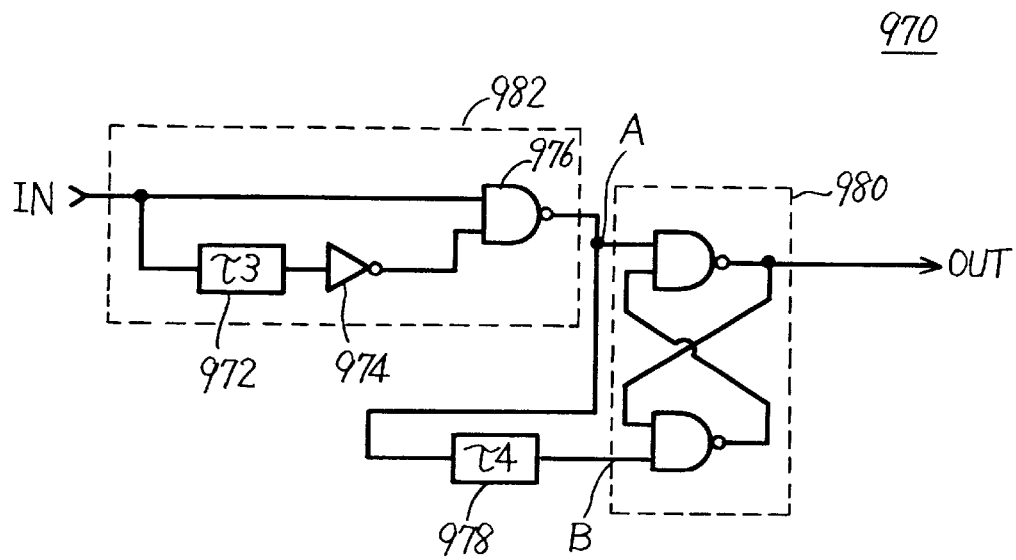
FIG. 21 is a block diagram schematically showing a structure of a pulse signal generation circuit 970 according to a ninth embodiment of the present invention.

FIG. 21 is a block diagram showing a structure of another pulse signal generation circuit 970.

Pulse generation circuit 970 includes an internal pulse generation circuit 982 receiving input pulse signal IN for providing an internal pulse signal, a delay circuit 978 for receiving and delaying an output of internal pulse generation circuit 982 by a predetermined time and providing the delayed output, and a flipflop circuit 980 having its output level altered according to outputs A and B of internal pulse generation circuit 982 and delay circuit 978, respectively.

Internal pulse generation circuit 982 includes a first delay circuit 972 for receiving and delaying input pulse signal IN for a predetermined time τ3, an inversion circuit 974 for inverting the output of first delay circuit 972, and a NAND circuit 976 for receiving input pulse signal IN and an output of inversion circuit 974 for providing an NANDed output.

Flipflop circuit 980 sets and resets the level of output signal OUT according to the outputs of NAND circuit 976 and second delay circuit 978, respectively.

Figure 22:
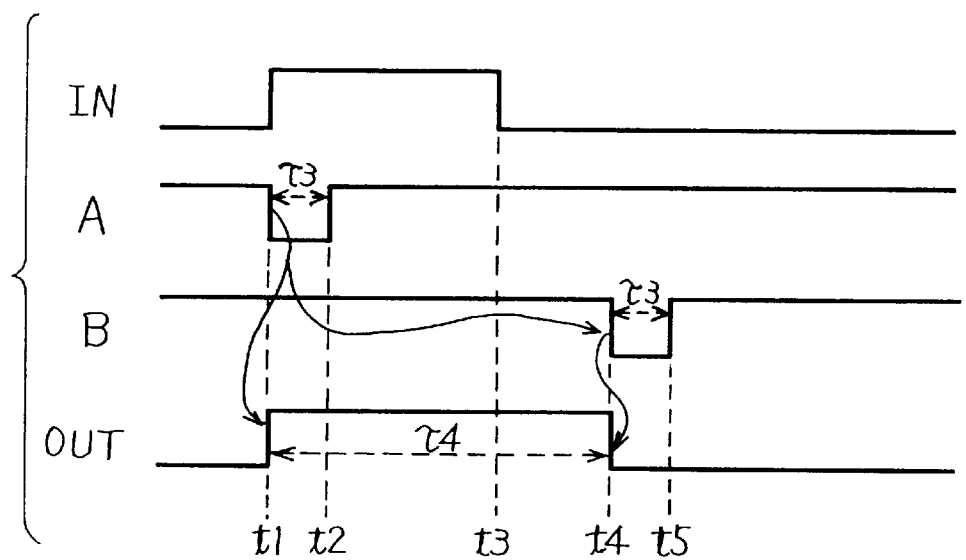
FIG. 22 is a timing chart for describing an operation of a pulse signal generation circuit 970.
Figure 23:
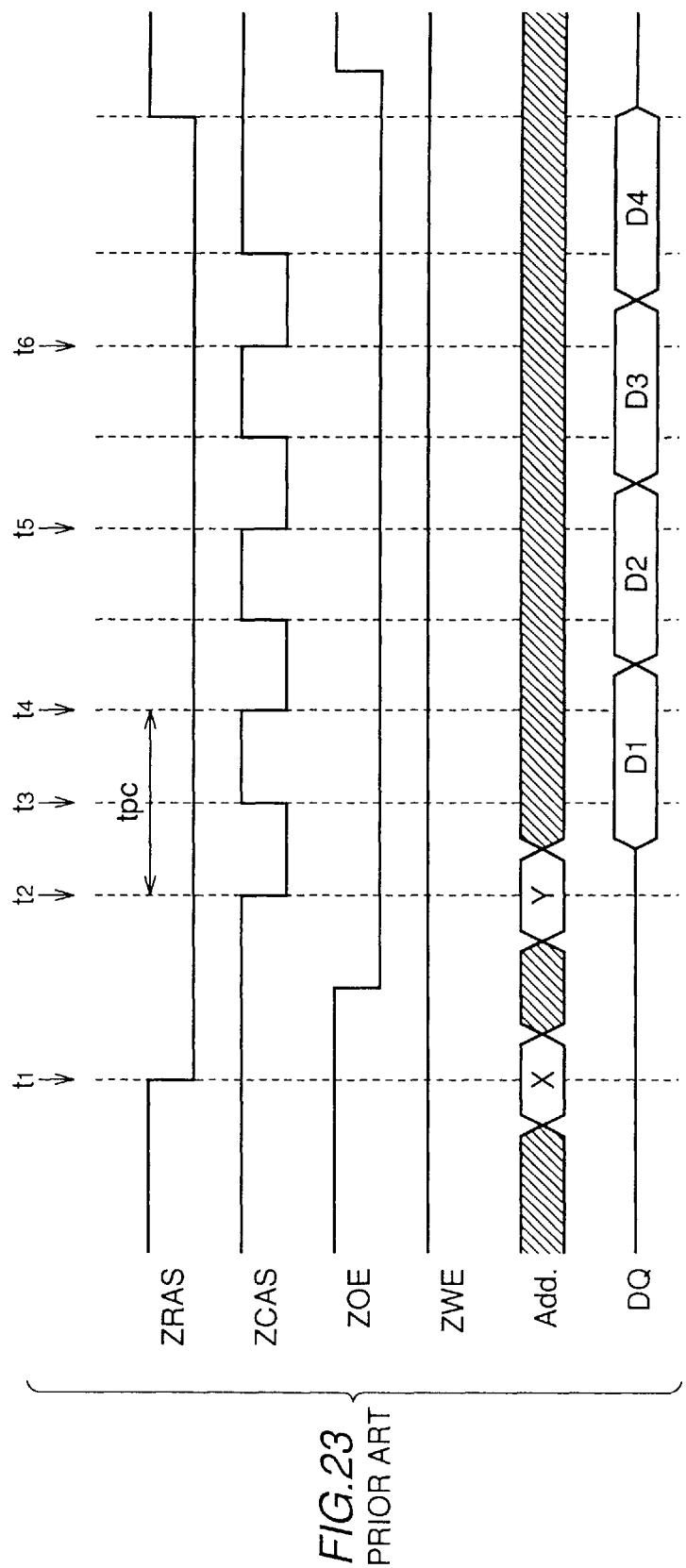
FIG. 23 is a timing chart for describing an operation of a hyper page mode in a conventional semiconductor memory device.
Figure 24:
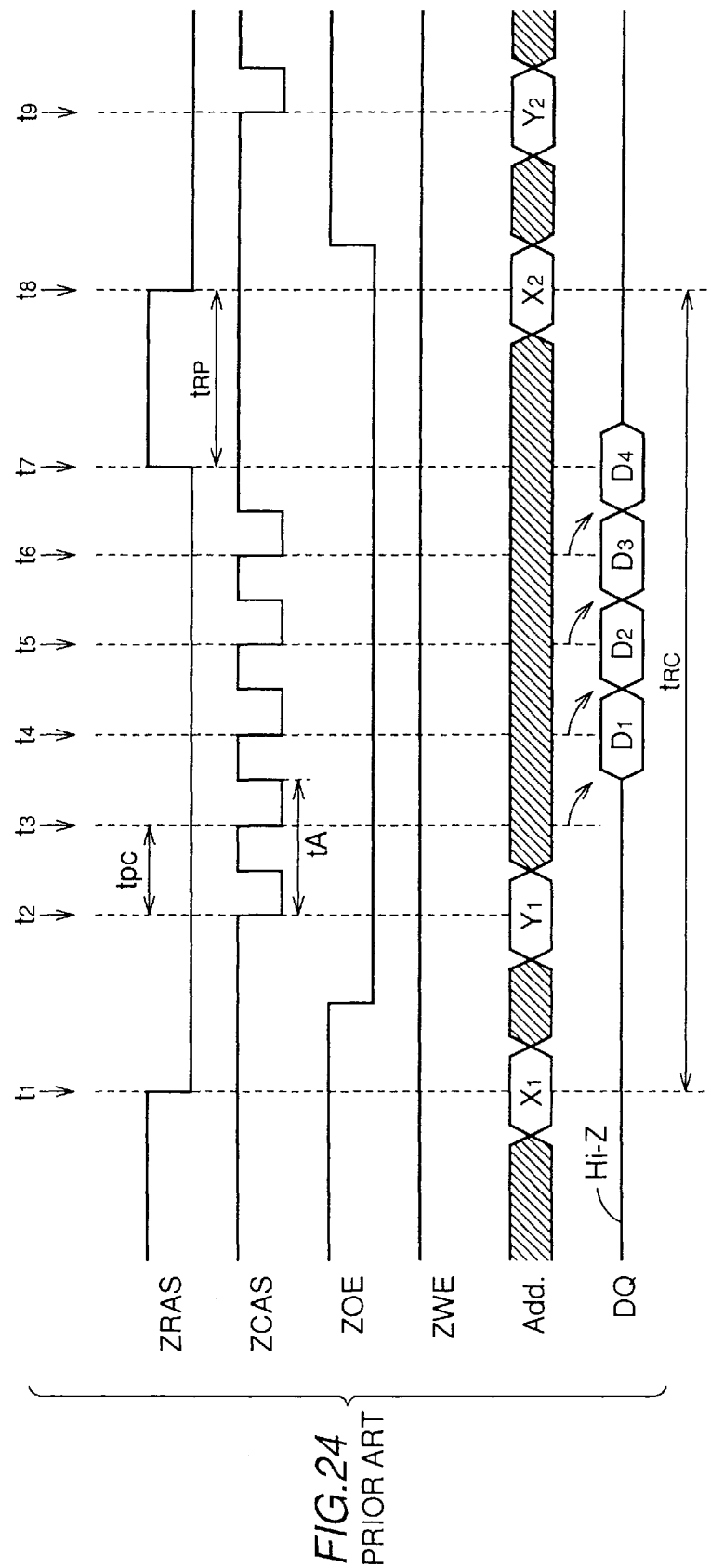
FIG. 24 is a timing chart showing an operation of a pipe line burst mode according to a conventional semiconductor memory device.

FIG. 22 is a timing chart for describing an operation of pulse signal generation circuit 972 of FIG. 21.

In response to a rising edge of input signal IN at time t1, a signal A having a pulse width τ3 which serves as a set signal of flipflop circuit 980 formed of a NAND circuit is output from internal pulse generation circuit 982.

At an elapse of τ4 from the rising edge of input signal IN, an output B having a pulse width τ3 serving as a reset signal of flipflop circuit 980 is output from delay circuit 978.

As a result, output signal OUT having a pulse width of τ4 is provided as shown FIG. 22.

Since flipflop circuit 980 is controlled on the basis of a rising edge of input signal IN in pulse generation circuit 970, the pulse width of output signal OUT is maintained at a constant value even when the H level period of signal IN becomes shorter than the pulse width τ4 of output signal OUT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device that can be switched between a first mode in which data readout according to activation of a column address strobe signal that shows a transition according to an external clock signal is output during a first cycle of said column address strobe signal, and a second mode in which readout data is output in a second cycle of said column address strobe signal following said first cycle, said semiconductor memory device comprising:
    a memory cell array including a plurality of memory cells arranged in a matrix of rows and columns,
    column select means for selecting a corresponding memory cell column according to a column address signal,
    readout amplifying means for amplifying data of a memory cell of said corresponding memory cell column,
    mode setting means for providing an operation mode designating signal that designates said first and second modes according to an external setting,
    control means responsive to said operation mode designating signal for activating an output buffer activation signal at a predetermined time after activation of said column address strobe signal when in said first mode, and for activating said output buffer activation signal in response to detection of initiation of said second cycle of said column address strobe signal when in said second mode, and
    an output buffer receiving an output of said readout amplifying means, and activated according to said output buffer activation signal for providing corresponding data.

2. The semiconductor memory device according to claim 1, wherein said control means comprises
    address transition detection means for detecting transition of said column address signal for providing an address transition detection signal,
    variable delay means receiving said column address strobe signal, and responsive to said operation mode designating signal for providing an internal delay signal which is delayed by said predetermined time in said first mode, and providing said column address strobe signal directly in said second mode,
    count means for counting a cycle of said column address strobe signal, and
    signal generation means for activating said output buffer activation signal according to activation of said address transition detection signal and activation of an output of said variable delay means in said first mode, and for activating said output buffer activation signal according to activation of outputs of said count means and said variable delay means in said second mode.

3. The semiconductor memory device according to claim 1, wherein said control means further comprises input timing control means for activating a data latch signal at a predetermined time after activation of said column address strobe signal in said first mode, and for activating the data latch signal according to activation of said column address strobe signal in said second mode when a write operation is designated by an external control signal,
    said semiconductor memory device further comprising an input buffer receiving externally applied write data, said input buffer holding said write data according to said data latch signal, and
    write means receiving an output of said input buffer, and controlled by said control means for providing said write data to a corresponding memory cell of a memory cell column selected by said column select means.

4. The semiconductor memory device according to claim 2, wherein said count means comprises a plurality of cascade-connected master slave type flipflop circuits receiving said column address strobe signal as an input, wherein said master slave type flipflop circuits of a second and subsequent stages out of said plurality of master slave type flipflop circuits operate receiving master outputs of respective preceding stages.

5. A semiconductor memory device comprising:
    control means receiving an external control signal including a column address strobe signal for controlling a readout operation and write operation of said semiconductor memory device,
    a memory cell array including a plurality of memory cells arranged in a matrix of rows and columns,
    column select means for selecting a corresponding memory cell column according to a column address signal,
    readout amplifying means for amplifying data of a memory cell of said corresponding memory cell column,
    an output buffer controlled by said control means for receiving an output of said readout amplifying means and providing corresponding data, and
    write means receiving externally applied write data, and controlled by said control means for providing said write data to a corresponding memory cell of a memory cell column selected by said column select means, wherein said control means renders said write means inactive during activation of said output buffer.

6. The semiconductor memory device according to claim 5, further comprising an input buffer receiving and holding externally applied write data, and a first plurality of data buses for transmitting write data from said input buffer to said write means, wherein said input buffer comprises
said first plurality of first data latch means, each for receiving and holding said write data,
switching means receiving outputs of said first data latch means at said first plurality of input nodes for switching connection with said first plurality of output nodes according to an external control signal, and
said first plurality of second data latch means for respectively receiving and holding data from said first plurality of output nodes, and for providing said data to corresponding said data buses respectively, wherein said switching means switches between a first state in which said input node and a corresponding said output node are respectively rendered conductive, and a second state in which a predetermined input node out of said input nodes and any of a selected said output node are rendered conductive according to said external control signal.

7. A semiconductor memory device operating in synchronization with an external clock signal, comprising:

a memory cell array including a plurality of memory cells arranged in a matrix of rows and columns, column select means for selecting a corresponding memory cell column according to a column address signal, control means for providing a write control signal according to an external control signal including said column address strobe signal and write enable signal, and write means receiving an externally applied write data for providing said write data to a corresponding memory cell in a memory cell column selected by said column select means according to said write control signal, wherein said control means comprises
latch means for maintaining a write designating signal at an active state in response to designation of a write operation according to said column address strobe signal and said write enable signal, and
pulse generation means responsive to activation of said write designating means for providing said write control signal of a predetermined pulse length,
wherein said latch means is reset according to activation of said write control signal.

8. The semiconductor memory device according to claim 7, further comprising an input buffer for receiving and holding externally applied write data, and a first plurality of data buses for transmitting write data from said input buffer to said write means, wherein said input buffer comprises
said first plurality of first data latch means for respectively receiving and holding said write data,
switching means receiving outputs of said first data latch means at said first plurality of input nodes for switching connection of a corresponding said first plurality of output nodes according to an external control signal, and
said first plurality of second data latch means for respectively receiving and holding data from said first plurality of output nodes, and for providing said data to corresponding said data buses respectively, wherein said switching means switches between a first state in which said input node and a corresponding said output node are respectively rendered conductive, and a second state in which a predetermined input node out of said input nodes and any of a selected said output node are rendered conductive.

9. The semiconductor device according to claim 1, wherein said control means comprises address transition detection means for detecting transition of said column address signal for providing an address transition detection signal, variable delay means receiving said column address strobe signal, and responsive to said operation mode designating signal for providing a first internal delay signal which is delayed by said predetermined time in said first mode, and providing a second internal delay signal which is delayed by a shorter time than said predetermined time in said second mode, count means for counting a cycle of said column address strobe signal, and signal generation means for activating said output buffer activation signal according to activation of said address transition detection signal and activation of an output of said variable delay means in said first mode, and for activating said output buffer activation signal according to activation of outputs of said count means and said variable delay means in said second mode.

* * * * *